US012805298B2

(12) United States Patent
Akkinepally et al.

(10) Patent No.: US 12,805,298 B2
(45) Date of Patent: Nov. 17, 2026

(54) HYBRID INTEGRATION OF BACK-END-OF-LINE LAYERS FOR DISAGGREGATED TECHNOLOGIES

(71) Applicant: Intel Corporation, Santa Clara, CA (US)

(72) Inventors: Praneeth Kumar Akkinepally, Tempe, AZ (US); Sivakumar Nagarajan, Chandler, AZ (US); Nisha Ananthakrishnan, Chandler, AZ (US); Santosh Shaw, Chandler, AZ (US); Wei Gao, Tempe, AZ (US)

(73) Assignee: Intel Foundry IP LLC, Santa Clara, CA (US)

( * ) Notice: Subject to any disclaimer, the term of this patent is extended or adjusted under 35 U.S.C. 154(b) by 83 days.

(21) Appl. No.: 18/147,820

(22) Filed: Dec. 29, 2022

(65) Prior Publication Data

US 2024/0222274 A1 Jul. 4, 2024

(51) Int. Cl.

| | |
|---|---|
| ***H01L 21/78*** | (2006.01) |
| ***H10W 20/20*** | (2026.01) |
| ***H10W 20/41*** | (2026.01) |
| ***H10W 20/42*** | (2026.01) |
| ***H10W 90/00*** | (2026.01) |
| *H10W 90/20* | (2026.01) |

(52) U.S. Cl.

CPC ......... *H10W 20/435* (2026.01); *H10W 20/20* (2026.01); *H10W 20/42* (2026.01); *H10W 90/00* (2026.01); *H10W 90/297* (2026.01); *H10W 90/722* (2026.01); *H10W 90/724* (2026.01)

(58) Field of Classification Search

CPC ............... H10W 20/435; H10W 20/20; H10W 20/42; H10W 90/00; H10W 90/297; H10W 90/722; H10W 90/724; H01L 2224/05568; H01L 2224/16145; H01L 23/522; H01L 23/5223; H01L 23/53295; H01L 2224/0401; H01L 2224/1703; H01L 2224/1713; H01L 25/0652

USPC ........................................................ 257/774

See application file for complete search history.

(56) References Cited

U.S. PATENT DOCUMENTS 7,622,364 B2 * 11/2009 Adkisson .............. H01L 23/562 257/620
9,059,110 B2 * 6/2015 Yook ................... H01L 23/3178
10,116,891 B2 * 10/2018 Raynor ................... H10F 39/18
10,158,072 B1 * 12/2018 Yang ...................... H10B 63/30

(Continued)

*Primary Examiner* — Vu A Vu
(74) *Attorney, Agent, or Firm* — Akona IP PC

(57) ABSTRACT

Integrated circuit (IC) dies, microelectronic assemblies, and related devices and methods, are disclosed herein. For example, in some embodiments, an IC die may include a substrate, a front-end-of-line (FEOL) layer over the substrate, where the FEOL layer includes a plurality of transistors, a first back-end-of-line (BEOL) layer comprising first interconnects, a second BEOL layer comprising second interconnects, and a third BEOL layer comprising third interconnects, wherein the first BEOL layer is between the FEOL layer and the second BEOL layer, the second BEOL layer is between the first BEOL layer and the third BEOL layer, and an electrically conductive fill material of the second interconnects is different from an electrically conductive fill material of the first interconnects and from an electrically conductive fill material of the third interconnects.

22 Claims, 27 Drawing Sheets

(56) References Cited

U.S. PATENT DOCUMENTS

| | | | | |
|---|---|---|---|---|
| 11,201,157 | B2 * | 12/2021 | Liu | H01L 25/50 |
| 11,327,228 | B2 * | 5/2022 | Hsu | G02B 6/12004 |
| 12,107,034 | B2 * | 10/2024 | Ding | H10W 20/023 |
| 2005/0026397 | A1 * | 2/2005 | Daubenspeck | H01L 23/585<br>257/E21.309 |
| 2020/0091156 | A1 * | 3/2020 | Sharma | H10B 10/00 |
| 2020/0227377 | A1 * | 7/2020 | Liff | H01L 25/0652 |
| 2020/0227401 | A1 * | 7/2020 | Elsherbini | H01L 25/0652 |
| 2020/0328186 | A1 * | 10/2020 | Liu | H01L 25/0657 |
| 2022/0181256 | A1 | 6/2022 | Gomes et al. | |
| 2022/0181313 | A1 | 6/2022 | Gomes et al. | |
| 2023/0343818 | A1 * | 10/2023 | Tsai | H10D 1/042 |

* cited by examiner

HYBRID INTEGRATION OF BACK-END-OF-LINE LAYERS FOR DISAGGREGATED TECHNOLOGIES

BACKGROUND

A front-end-of-line (FEOL) layer of an integrated circuit (IC) die generally refers to a layer in which active or passive circuitry based on highly crystalline semiconductor materials are formed, e.g., front-end transistors of logic devices. A back-end-of-line (BEOL) layer of such a die refers to a layer above the FEOL layer, in which either further active or passive circuitry (e.g., back-end transistors) and/or conductive pathways for providing connectivity for the active or passive circuitry are formed. A die typically includes multiple BEOL layers where conductive pathways such as conductive traces and/or conductive vias are included. In general, FEOL and BEOL refer to different layers, or different fabrication processes used to manufacture different portions of IC devices in context of complementary metal oxide semiconductor (CMOS) processes (e.g., logic devices in the FEOL layer, peripheral circuitry and/or interconnects in the BEOL layer). A far BEOL (FBEOL) layer of an IC die is a layer above the one or more BEOL layers, the FBEOL layer typically including a top metal layer, a passivation layer, and conductive contacts for coupling the die to other components such as a package substrate, an interposer, a circuit board, or another die.

For the past several decades, the scaling of features in integrated circuits has been a driving force behind an ever-growing semiconductor industry. Scaling to smaller and smaller features enables increased densities of functional units on the limited real estate of semiconductor dies. For example, shrinking transistor size allows for the incorporation of an increased number of memory or logic devices on a die, lending to the fabrication of products with increased capacity. The drive for the ever-increasing capacity, however, is not without issue. The necessity to optimize the performance of each IC die and each IC package that includes one or more dies becomes increasingly significant. In particular, heterogenous/disaggregated packaging architectures aim to optimize performance by disaggregating single monolithic die into multiple dies (also referred to as “chiplets” or “tiles”) such as compute, graphics, system-on-chip (SoC), etc. These different dies could be manufactured by different foundries and/or according to different manufacturing technologies for better performance, optimized yield, cost, or accelerated ramp, and later assembled into a single package. However, dies manufactured by different foundries and/or according to different manufacturing technologies may differ in, e.g., metallurgy, topography, and passivation surfaces, which, in turn, result in different assembly design rules (DRs). Attaching such dies onto a single package substrate, interposer, or a mold complex presents significant challenges due to bumping and assembly DR differences, bonding yield, passivation mismatch, chip-to-package interactions, etc. These challenges are generally present for all disaggregated technologies, and if FBEOL processes for two dies are radically different, the challenges are exacerbated even further.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
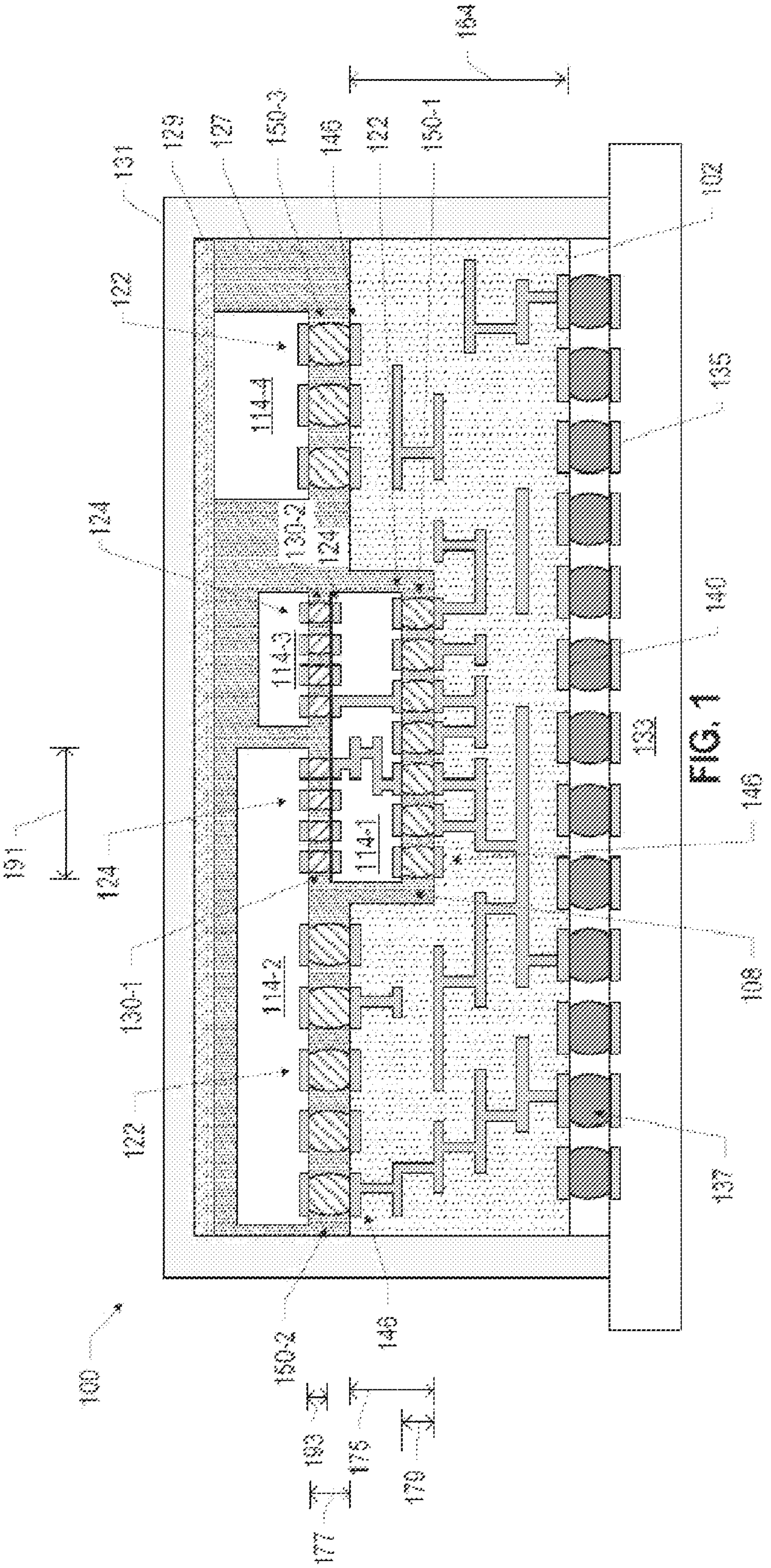
FIG. 1 is a side, cross-sectional view of an example microelectronic assembly, in accordance with various embodiments.

Hybrid integration of BEOL layers for disaggregated technologies and associated IC dies, microelectronic assemblies, and related devices and methods, are disclosed herein. In particular, such hybrid integration is applicable to scenarios where an IC die with an FEOL layer and one or more BEOL layers, including FBEOL layers, manufactured by one foundry, is processed further by another foundry to add additional BEOL layers to make the die compatible with dies manufactured by that foundry or further foundries. In some embodiments, a resulting IC die may include an FEOL layer that includes a plurality of transistors, a first BEOL layer comprising first interconnects, a second BEOL layer comprising second interconnects, and a third BEOL layer comprising third interconnects, wherein the first BEOL layer is between the FEOL layer and the second BEOL layer, the second BEOL layer is between the first BEOL layer and the third BEOL layer, and an electrically conductive fill material of the second interconnects is different from an electrically conductive fill material of the first interconnects and from an electrically conductive fill material of the third interconnects. Various ones of the embodiments disclosed herein may help achieve reliable inclusion, in a single package, of multiple IC dies at a lower cost, with improved power efficiency, with higher bandwidth, and/or with greater design flexibility, relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

For convenience, the phrase "FIG. 18" may be used to refer to the collection of drawings of FIGS. 18A-18J. To not clutter the drawings, if multiple instances of certain elements are illustrated, only some of the elements may be labeled with a reference sign. The drawings are not necessarily to scale. Although many of the drawings illustrate rectilinear structures with flat walls and right-angle corners, this is simply for ease of illustration and may not reflect real-life process limitations which may cause various features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of IC dies manufactured using hybrid integration of BEOL layers for disaggregated technologies as described herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used to describe a range of dimensions, the phrase "between X and Y" represents a range that includes X and Y. When used to describe a location of an element, the phrase "between X and Y" represents a region that is spatially between element X and element Y. Although certain elements may be referred to in the singular herein, such elements may include multiple sub-elements. For example, "an insulating material" may include one or more insulating materials, while a "metal" may include one or more metals.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." As used herein, the term "insulating" means "electrically insulating," unless otherwise specified. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations may be described using terms commonly employed by those skilled in the art to convey the substance of their work to others skilled in the art. For example, if used, the terms "oxide," "carbide," "nitride," "sulfide," etc. refer to compounds containing, respectively, oxygen, carbon, nitrogen, sulfur, etc., the term "high-k dielectric" refers to a material having a higher dielectric constant (k) than silicon oxide, while the term "low-k dielectric" refers to a material having a lower k than silicon oxide. In another example, as used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−20%, e.g., within +/−5% or within +/−2%, of a target value based on the context of a particular value as described herein or as known in the art.

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the heat spreader 131, the thermal interface material 129, the mold material 127, the die 114-3, the die 114-4, the second-level interconnects 137, and/or the circuit board 133 may not be included. Further, FIG. 1 illustrates a number of elements that are omitted from subsequent drawings for ease of illustration, but may be included in any of the microelectronic assemblies 100 disclosed herein. Examples of such elements include the heat spreader 131, the thermal interface material 129, the mold material 127, the second-level interconnects 137, and/or the circuit board 133. Many of the elements of the microelectronic assembly 100 of FIG. 1 are included in other ones of the accompanying figures; the discussion of these elements is not repeated when discussing these figures, and any of these elements may take any of the forms disclosed herein. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP. Any of the dies 114 may be fabricated using hybrid integration of BEOL layers for disaggregated technologies as described herein.

The microelectronic assembly 100 may include a package substrate 102 coupled to a die 114-1 by die-to-package substrate (DTPS) interconnects 150-1. In particular, the top surface of the package substrate 102 may include a set of conductive contacts 146, and the bottom surface of the die 114-1 may include a set of conductive contacts 122; the conductive contacts 122 at the bottom surface of the die 114-1 may be electrically and mechanically coupled to the conductive contacts 146 at the top surface of the package substrate 102 by the DTPS interconnects 150-1. In the embodiment of FIG. 1, the top surface of the package substrate 102 includes a recess 108 in which the die 114-1 is at least partially disposed; the conductive contacts 146 to which the die 114-1 is coupled are located at the bottom of the recess 108. In other embodiments, the die 114-1 may not be disposed in a recess (e.g., as discussed below with reference to FIGS. 9-11). Any of the conductive contacts disclosed herein (e.g., the conductive contacts 122, 124, 146, 140, and/or 135) may include bond pads, posts, or any other suitable conductive contact, for example.

The package substrate 102 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In particular, when the package substrate 102 is formed using standard printed circuit board (PCB) processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable.

In some embodiments, one or more of the conductive pathways in the package substrate 102 may extend between a conductive contact 146 at the top surface of the package substrate 102 and a conductive contact 140 at the bottom surface of the package substrate 102. In some embodiments, one or more of the conductive pathways in the package substrate 102 may extend between a conductive contact 146 at the bottom of the recess 108 and a conductive contact 140 at the bottom surface of the package substrate 102. In some embodiments, one or more of the conductive pathways in the package substrate 102 may extend between different conductive contacts 146 at the top surface of the package substrate 102 (e.g., between a conductive contact 146 at the bottom of the recess 108 and a different conductive contact 146 at the top surface of the package substrate 102). In some embodiments, one or more of the conductive pathways in the package substrate 102 may extend between different conductive contacts 140 at the bottom surface of the package substrate 102.

The dies 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 20. The conductive pathways in the dies 114 may be bordered by liner materials, such as adhesion liners and/or barrier liners, as suitable.

In some embodiments, the die 114-1 may include conductive pathways to route power, ground, and/or signals to/from some of the other dies 114 included in the microelectronic assembly 100. For example, the die 114-1 may include through-substrate vias (TSVs, including a conductive material via, such as a metal via, isolated from the surrounding silicon or other semiconductor material by a barrier oxide) or other conductive pathways through which power, ground, and/or signals may be transmitted between the package substrate 102 and one or more dies 114 "on top" of the die 114-1 (e.g., in the embodiment of FIG. 1, the die 114-2 and/or the die 114-3). In some embodiments, the die 114-1 may include conductive pathways to route power, ground, and/or signals between different ones of the dies 114 "on top" of the die 114-1 (e.g., in the embodiment of FIG. 1, the die 114-2 and the die 114-3). In some embodiments, the die 114-1 may be the source and/or destination of signals communicated between the die 114-1 and other dies 114 included in the microelectronic assembly 100.

In some embodiments, the die 114-1 may not route power and/or ground to the die 114-2; instead, the die 114-2 may couple directly to power and/or ground lines in the package substrate 102. By allowing the die 114-2 to couple directly to power and/or ground lines in the package substrate 102, such power and/or ground lines need not be routed through the die 114-1, allowing the die 114-1 to be made smaller or to include more active circuitry or signal pathways.

In some embodiments, the die 114-1 may only include conductive pathways, and may not contain active or passive circuitry. In other embodiments, the die 114-1 may include active or passive circuitry (e.g., transistors, diodes, resistors, inductors, and capacitors, among others). In some embodiments, the die 114-1 may include one or more device layers including transistors (e.g., as discussed below with reference to FIG. 20. When the die 114-1 includes active circuitry, power and/or ground signals may be routed through the package substrate 102 and to the die 114-1 through the conductive contacts 122 on the bottom surface of the die 114-1.

Although FIG. 1 illustrates a specific number and arrangement of conductive pathways in the package of 102 and/or one or more of the dies 114, these are simply illustrative, and any suitable number and arrangement may be used. The conductive pathways disclosed herein (e.g., conductive traces and/or conductive vias) may be formed of any appropriate conductive material, such as copper, silver, nickel, gold, aluminum, or other metals or alloys, for example.

In some embodiments, the package substrate 102 may be a lower density medium and the die 114-1 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

Figure 2:
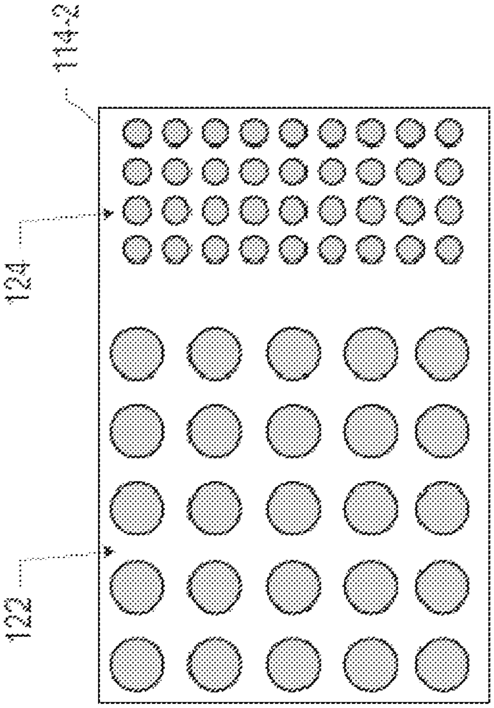
FIG. 2 is a bottom view of a die included in the microelectronic assembly of FIG. 1, in accordance with various embodiments.

The microelectronic assembly 100 of FIG. 1 may also include a die 114-2. The die 114-2 may be electrically and mechanically coupled to the package substrate 102 by DTPS interconnects 150-2, and may be electrically and mechanically coupled to the die 114-1 by die-to-die (DTD) interconnects 130-1. In particular, the top surface of the package substrate 102 may include a set of conductive contacts 146, and the bottom surface of the die 114-2 may include a set of conductive contacts 122; the conductive contacts 122 at the bottom surface of the die 114-1 may be electrically and mechanically coupled to the conductive contacts 146 at the top surface of the package substrate 102 by the DTPS interconnects 150-2. Further, the top surface of the die 114-1 may include a set of conductive contacts 124, and the bottom surface of the die 114-2 may include a set of conductive contacts 124; the conductive contacts 124 at the bottom surface of the die 114-2 may be electrically and mechanically coupled to some of the conductive contacts 124 at the top surface of the die 114-1 by the DTD interconnects 130-1. FIG. 2 is a bottom view of the die 114-2 of the microelectronic assembly 100 of FIG. 1, showing the "coarser" conductive contacts 122 and the "finer" conductive contacts 124. The die 114-2 of the microelectronic assembly 100 may thus be a single-sided die (in the sense that the die 114-2 only has conductive contacts 122/124 on a single surface), and may be a mixed-pitch die (in the sense that the die 114-2 has sets of conductive contacts 122/124 with different pitch). Although FIG. 2 illustrates the conductive contacts 122 and the conductive contacts 124 as each being arranged in a rectangular array, this need not be the case, and the conductive contacts 122 and 124 may be arranged in any suitable pattern (e.g., triangular, hexagonal, rectangular, different arrangements between the conductive contacts 122 and 124, etc.). A die 114 that has DTPS interconnects 150 and DTD interconnects 130 at the same surface may be referred to as a mixed-pitch die 114; more generally, a die 114 that has interconnects 130 of different pitches at a same surface may be referred to as a mixed-pitch die 114.

The die 114-2 may extend over the die 114-1 by an overlap distance 191. In some embodiments, the overlap distance 191 may be between 0.5 millimeters and 5 millimeters (e.g., between 0.75 millimeters and 2 millimeters, or approximately 1 millimeter).

The microelectronic assembly 100 of FIG. 1 may also include a die 114-3. The die 114-3 may be electrically and mechanically coupled to the die 114-1 by DTD interconnects 130-2. In particular, the bottom surface of the die 114-3 may include a set of conductive contacts 124 that are electrically and mechanically coupled to some of the conductive contacts 124 at the top surface of the die 114-1 by the DTD interconnects 130-2. In the embodiment of FIG. 1, the die 114-3 may be a single-sided, single-pitch die; in other embodiments, the die 114-3 may be a double-sided (or "multi-level," or "omni-directional") die, and additional components may be disposed on the top surface of the die 114-3.

As discussed above, in the embodiment of FIG. 1, the die 114-1 may provide high density interconnect routing in a localized area of the microelectronic assembly 100. In some embodiments, the presence of the die 114-1 may support direct chip attach of fine-pitch semiconductor dies (e.g., the dies 114-2 and 114-3) that cannot be attached entirely directly to the package substrate 102. In particular, as discussed above, the die 114-1 may support trace widths and spacings that are not achievable in the package substrate 102. The proliferation of wearable and mobile electronics, as well as Internet of Things (IoT) applications, are driving reductions in the size of electronic systems, but limitations of the PCB manufacturing process and the mechanical consequences of thermal expansion during use have meant that chips having fine interconnect pitch cannot be directly mounted to a PCB. Various embodiments of the microelectronic assemblies 100 disclosed herein may be capable of supporting chips with high density interconnects and chips with low-density interconnects without sacrificing performance or manufacturability.

The microelectronic assembly 100 of FIG. 1 may also include a die 114-4. The die 114-4 may be electrically and mechanically coupled to the package substrate 102 by DTPS interconnects 150-3. In particular, the bottom surface of the die 114-4 may include a set of conductive contacts 122 that are electrically and mechanically coupled to some of the conductive contacts 146 at the top surface of the package substrate 102 by the DTPS interconnects 150-3. In the embodiment of FIG. 1, the die 114-4 may be a single-sided, single-pitch die; in other embodiments, the die 114-4 may be a double-sided die, and additional components may be disposed on the top surface of the die 114-4. Additional passive components, such as surface-mount resistors, capacitors, and/or inductors, may be disposed on the top surface or the bottom surface of the package substrate 102, or embedded in the package substrate 102.

The microelectronic assembly 100 of FIG. 1 may also include a circuit board 133. The package substrate 102 may be coupled to the circuit board 133 by second-level interconnects 137 at the bottom surface of the package substrate 102. In particular, the package substrate 102 may include conductive contacts 140 at its bottom surface, and the circuit board 133 may include conductive contacts 135 at its top surface; the second-level interconnects 137 may electrically and mechanically couple the conductive contacts 135 and the conductive contacts 140. The second-level interconnects 137 illustrated in FIG. 1 are solder balls (e.g., for a ball grid array arrangement), but any suitable second-level interconnects 137 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second-level interconnects 137 may not couple the package substrate 102 to a circuit board 133, but may instead couple the package substrate 102 to another IC package, an interposer, or any other suitable component.

The microelectronic assembly 100 of FIG. 1 may also include a mold material 127. The mold material 127 may extend around one or more of the dies 114 on the package substrate 102. In some embodiments, the mold material 127 may extend above one or more of the dies 114 on the package substrate 102. In some embodiments, the mold material 127 may extend between one or more of the dies 114 and the package substrate 102 around the associated DTPS interconnects 150; in such embodiments, the mold material 127 may serve as an underfill material. In some embodiments, the mold material 127 may extend between different ones of the dies 114 around the associated DTD interconnects 130; in such embodiments, the mold material 127 may serve as an underfill material. The mold material 127 may include multiple different mold materials (e.g., an underfill material, and a different overmold material). The mold material 127 may be an insulating material, such as an appropriate epoxy material. In some embodiments, the mold material 127 may include an underfill material that is an epoxy flux that assists with soldering the dies 114-1/114-2 to the package substrate 102 when forming the DTPS interconnects 150-1 and 150-2, and then polymerizes and encapsulates the DTPS interconnects 150-1 and 150-2. The mold material 127 may be selected to have a coefficient of thermal expansion (CTE) that may mitigate or minimize the stress between the dies 114 and the package substrate 102 arising from uneven thermal expansion in the microelectronic assembly 100. In some embodiments, the CTE of the mold material 127 may have a value that is intermediate to the CTE of the package substrate 102 (e.g., the CTE of the dielectric material of the package substrate 102) and a CTE of the dies 114.

The microelectronic assembly 100 of FIG. 1 may also include a thermal interface material (TIM) 129. The TIM 129 may include a thermally conductive material (e.g., metal particles) in a polymer or other binder. The TIM 129 may be a thermal interface material paste or a thermally conductive epoxy (which may be a fluid when applied and may harden upon curing, as known in the art). The TIM 129 may provide a path for heat generated by the dies 114 to readily flow to the heat spreader 131, where it may be spread and/or dissipated. Some embodiments of the microelectronic assembly 100 of FIG. 1 may include a sputtered back side metallization (not shown) across the mold material 127 and the dies 114; the TIM 129 (e.g., a solder TIM) may be disposed on this back side metallization.

The microelectronic assembly 100 of FIG. 1 may also include a heat spreader 131. The heat spreader 131 may be used to move heat away from the dies 114 (e.g., so that the heat may be more readily dissipated by a heat sink or other thermal management device). The heat spreader 131 may include any suitable thermally conductive material (e.g., metal, appropriate ceramics, etc.), and may include any suitable features (e.g., fins). In some embodiments, the heat spreader 131 may be an integrated heat spreader.

The DTPS interconnects 150 disclosed herein may take any suitable form. In some embodiments, a set of DTPS interconnects 150 may include solder (e.g., solder bumps or balls that are subject to a thermal reflow to form the DTPS interconnects 150). DTPS interconnects 150 that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects 150 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects 130 disclosed herein may take any suitable form. The DTD interconnects 130 may have a finer pitch than the DTPS interconnects 150 in a microelectronic assembly. In some embodiments, the dies 114 on either side of a set of DTD interconnects 130 may be unpackaged dies, and/or the DTD interconnects 130 may include small conductive bumps or pillars (e.g., copper bumps or pillars) attached to the conductive contacts 124 by solder. The DTD interconnects 130 may have too fine a pitch to couple to the package substrate 102 directly (e.g., to fine to serve as DTPS interconnects 150). In some embodiments, a set of DTD interconnects 130 may include solder. DTD interconnects 130 that include solder may include any appropriate solder material, such as any of the materials discussed above. In some embodiments, a set of DTD interconnects 130 may include an anisotropic conductive material, such as any of the materials discussed above. In some embodiments, the DTD interconnects 130 may be used as data transfer lanes, while the DTPS interconnects 150 may be used for power and ground lines, among others.

In some embodiments, some or all of the DTD interconnects 130 in a microelectronic assembly 100 may be metal-to-metal interconnects (e.g., copper-to-copper interconnects, or plated interconnects). In such embodiments, the conductive contacts 124 on either side of the DTD interconnect 130 may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts 124). In some embodiments, one side of a DTD interconnect 130 may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, some or all of the DTD interconnects 130 in a microelectronic assembly 100 may be solder interconnects that include a solder with a higher melting point than a solder included in some or all of the DTPS interconnects 150. For example, when the DTD interconnects 130 in a microelectronic assembly 100 are formed before the DTPS interconnects 150 are formed (e.g., as discussed below with reference to FIGS. 17A-17F), solder-based DTD interconnects 130 may use a higher-temperature solder (e.g., with a melting point above 200 degrees Celsius), while the DTPS interconnects 150 may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In the microelectronic assemblies 100 disclosed herein, some or all of the DTPS interconnects 150 may have a larger pitch than some or all of the DTD interconnects 130. DTD interconnects 130 may have a smaller pitch than DTPS interconnects 150 due to the greater similarity of materials in the different dies 114 on either side of a set of DTD interconnects 130 than between the die 114 and the package substrate 102 on either side of a set of DTPS interconnects 150. In particular, the differences in the material composition of a die 114 and a package substrate 102 may result in differential expansion and contraction of the die 114 and the package substrate 102 due to heat generated during operation (as well as the heat applied during various manufacturing operations). To mitigate damage caused by this differential expansion and contraction (e.g., cracking, solder bridging, etc.), the DTPS interconnects 150 may be formed larger and farther apart than DTD interconnects 130, which may experience less thermal stress due to the greater material similarity of the pair of dies 114 on either side of the DTD interconnects. In some embodiments, the DTPS interconnects 150 disclosed herein may have a pitch between 80 microns and 300 microns, while the DTD interconnects 130 disclosed herein may have a pitch between 7 microns and 100 microns.

The elements of the microelectronic assembly 100 may have any suitable dimensions. Only a subset of the accompanying figures are labeled with reference numerals representing dimensions, but this is simply for clarity of illustration, and any of the microelectronic assemblies 100 disclosed herein may have components having the dimensions discussed herein. For example, in some embodiments, the thickness 164 of the package substrate 102 may be between 0.1 millimeters and 1.4 millimeters (e.g., between 0.1 millimeters and 0.35 millimeters, between 0.25 millimeters and 0.8 millimeters, or approximately 1 millimeter). In some embodiments, the recess 108 may have a depth 175 between 10 microns and 200 microns (e.g., between 10 microns and 30 microns, between 30 microns and 100 microns, between 60 microns and 80 microns, or approximately 75 microns). In some embodiments, the depth 175 may be equal to a certain number of layers of the dielectric material in the package substrate 102. For example, the depth 175 may be approximately equal to between one and five layers of the dielectric material in the package substrate 102 (e.g., two or three layers of the dielectric material). In some embodiments, the depth 175 may be equal to the thickness of a solder resist material (not shown) on the top surface of the package substrate 102.

In some embodiments, the distance 179 between the bottom surface of the die 114-1 and the proximate top surface of the package substrate 102 (at the bottom of the recess 108) may be less than the distance 177 between the bottom surface of the die 114-2 and the proximate top surface of the package substrate 102. In some embodiments, the distance 179 may be approximately the same as the distance 177. In some embodiments, the distance 177 between the bottom surface of the die 114-2 and the proximate top surface of the package substrate 102 may be greater than the distance 193 between the bottom surface of the die 114-2 and the proximate top surface of the die 114-1. In other embodiments, the distance 177 may be less than or equal to the distance 193.

Figure 3:
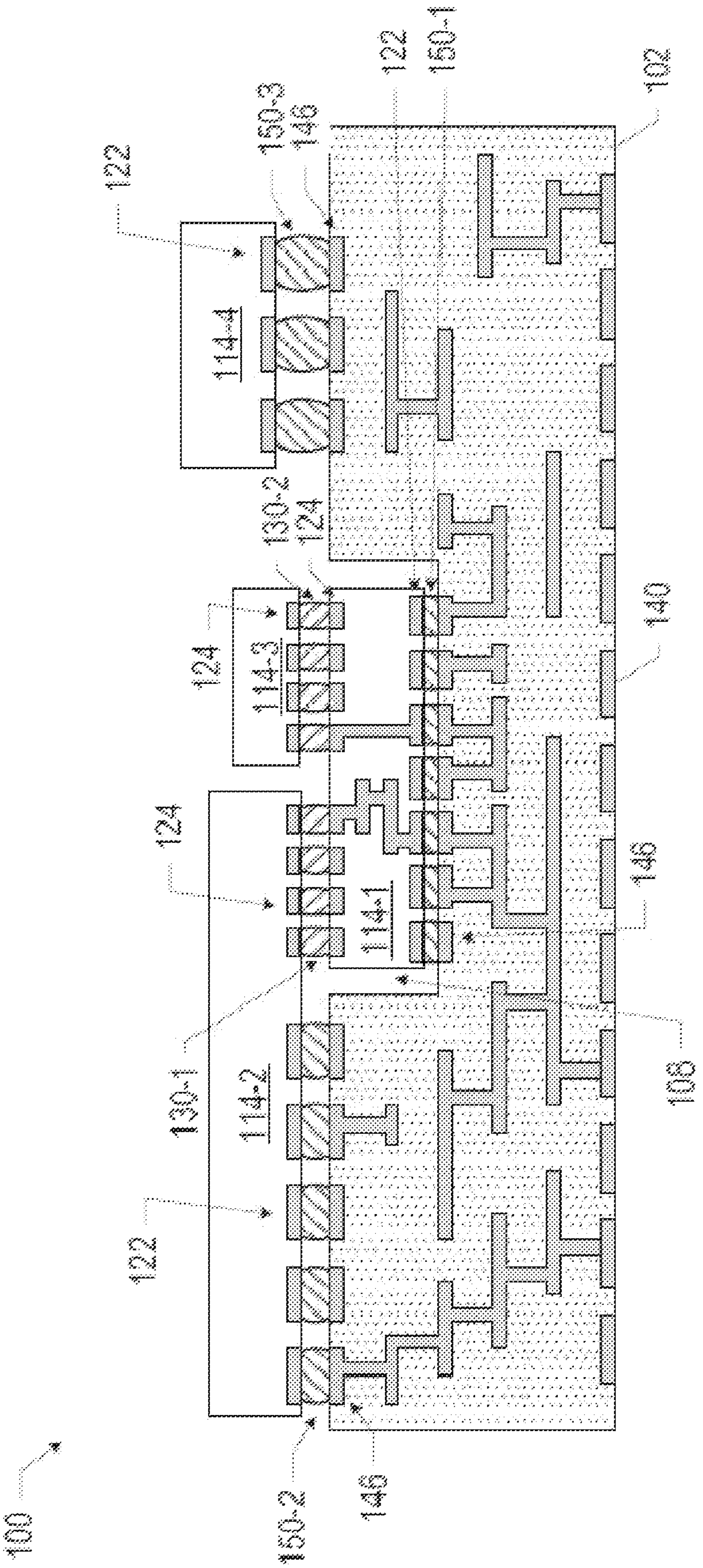
FIGS. 3-11 are side, cross-sectional views of example microelectronic assemblies, in accordance with various embodiments.

In some embodiments, the top surface of the die 114-1 may extend higher than the top surface of the package substrate 102, as illustrated in FIG. 1. In other embodiments, the top surface of the die 114-1 may be substantially coplanar with the top surface of the package substrate 102, or may be recessed below the top surface of the package substrate 102. FIG. 3 illustrates an example of the former embodiment. Although various ones of the figures illustrate microelectronic assemblies 100 having a single recess 108 in the package substrate 102, the thickness of 102 may include multiple recesses 108 (e.g., having the same or different dimensions, and each having a die 114 disposed therein), or no recesses 108. Examples of the former embodiments are discussed below with reference to FIGS. 7-8, and examples of the latter embodiments are discussed below with reference to FIGS. 9-11. In some embodiments, a recess 108 may be located at the bottom surface of the package substrate 102 (e.g., proximate to the conductive contacts 140), instead of or in addition to a recess 108 at the top surface of the package substrate 102.

Figure 4:
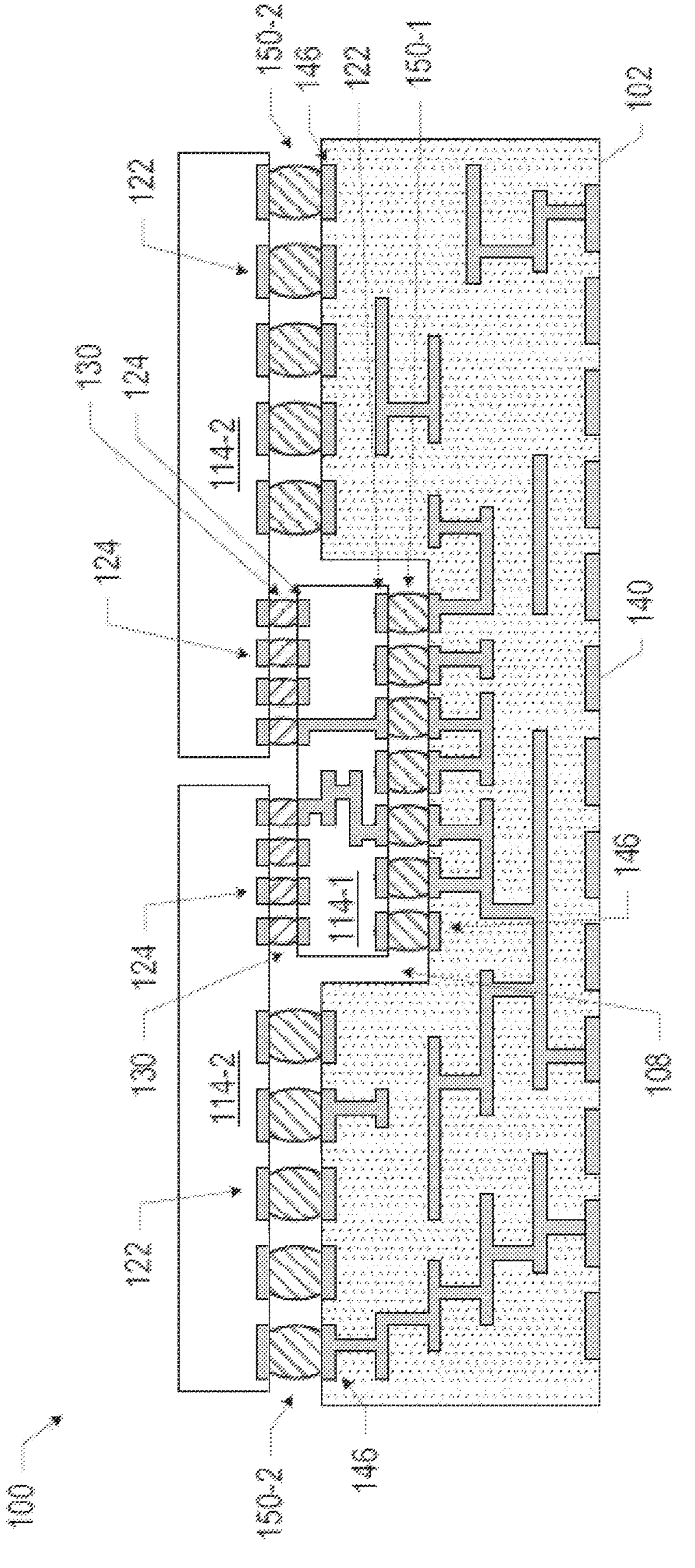

In the embodiment of FIG. 1, a single die 114-2 is illustrated as "spanning" the package substrate 102 and the die 114-1. In some embodiments of the microelectronic assemblies 100 disclosed herein, multiple dies 114 may span the package substrate 102 and another die 114. For example, FIG. 4 illustrates an embodiment in which two dies 114-2 each have conductive contacts 122 and conductive contacts 124 disposed at the bottom surfaces; the conductive contacts 122 of the dies 114-2 are coupled to conductive contacts 146 at the top surface of the package substrate 102 via DTPS interconnects 150-2, and the conductive contacts 124 of the dies 114-2 are coupled to conductive contacts 124 at the top surface of the die 114 via DTD interconnects 130. In some embodiments, power and/or ground signals may be provided directly to the dies 114 of the microelectronic assembly 100 of FIG. 4 through the package substrate 102, and the die 114-1 may, among other things, route signals between the dies 114-2.

Figure 5:
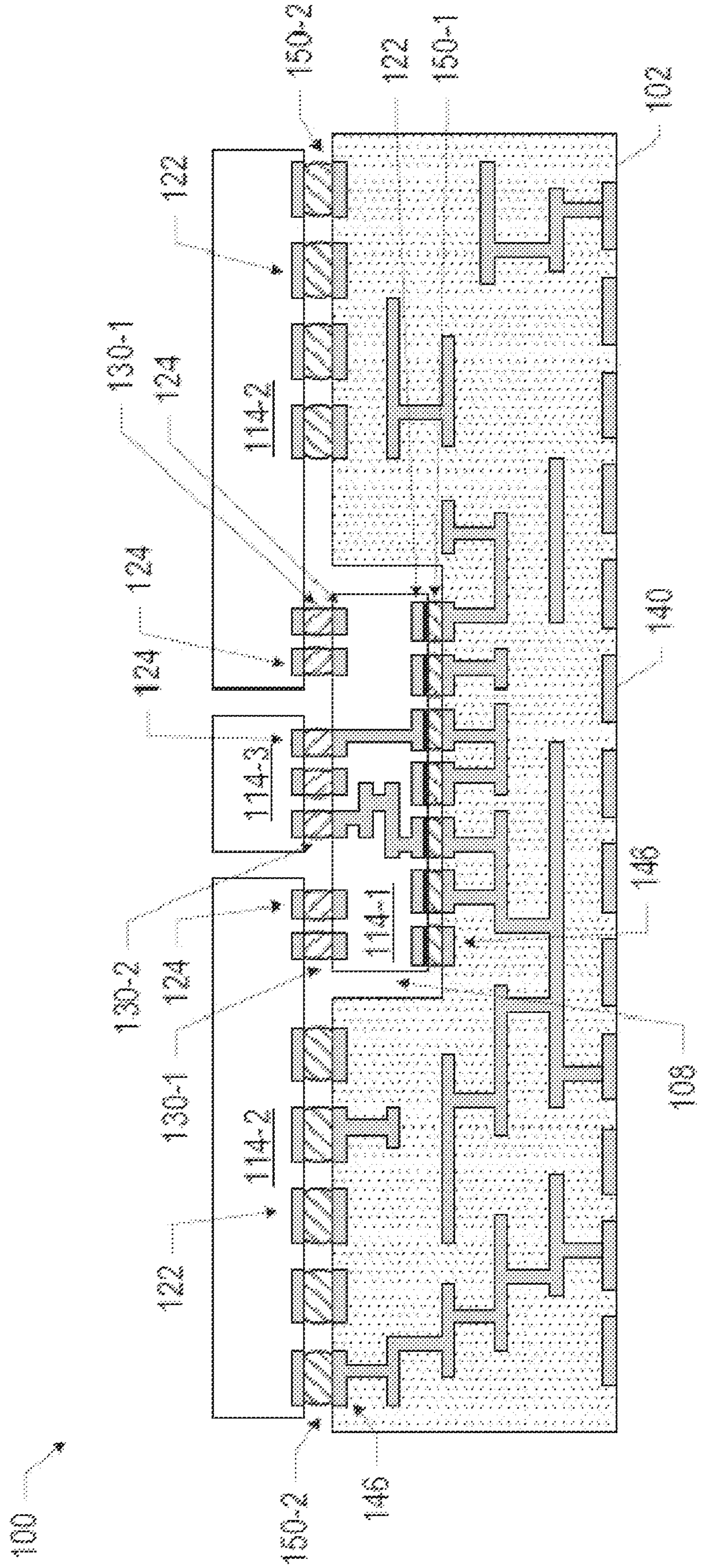

In some embodiments, the die 114-1 may be arranged as a bridge between multiple other dies 114, and may also have additional dies 114 disposed thereon. For example, FIG. 5 illustrates an embodiment in which two dies 114-2 each have conductive contacts 122 and conductive contacts 124 disposed at the bottom surfaces; the conductive contacts 122 of the dies 114-2 are coupled to conductive contacts 146 at the top surface of the package substrate 102 via DTPS interconnects 150-2, and the conductive contacts 124 of the dies 114-2 are coupled to conductive contacts 124 at the top surface of the die 114 via DTD interconnects 130 (e.g., as discussed above with reference to FIG. 4). Additionally, a die 114-3 (or multiple dies 114-3, not shown) is coupled to the die 114-1 by conductive contacts 124 on proximate surfaces of these dies 114 and intervening DTD interconnects 130-2 (e.g., as discussed above with reference to FIG. 1).

Figure 6:
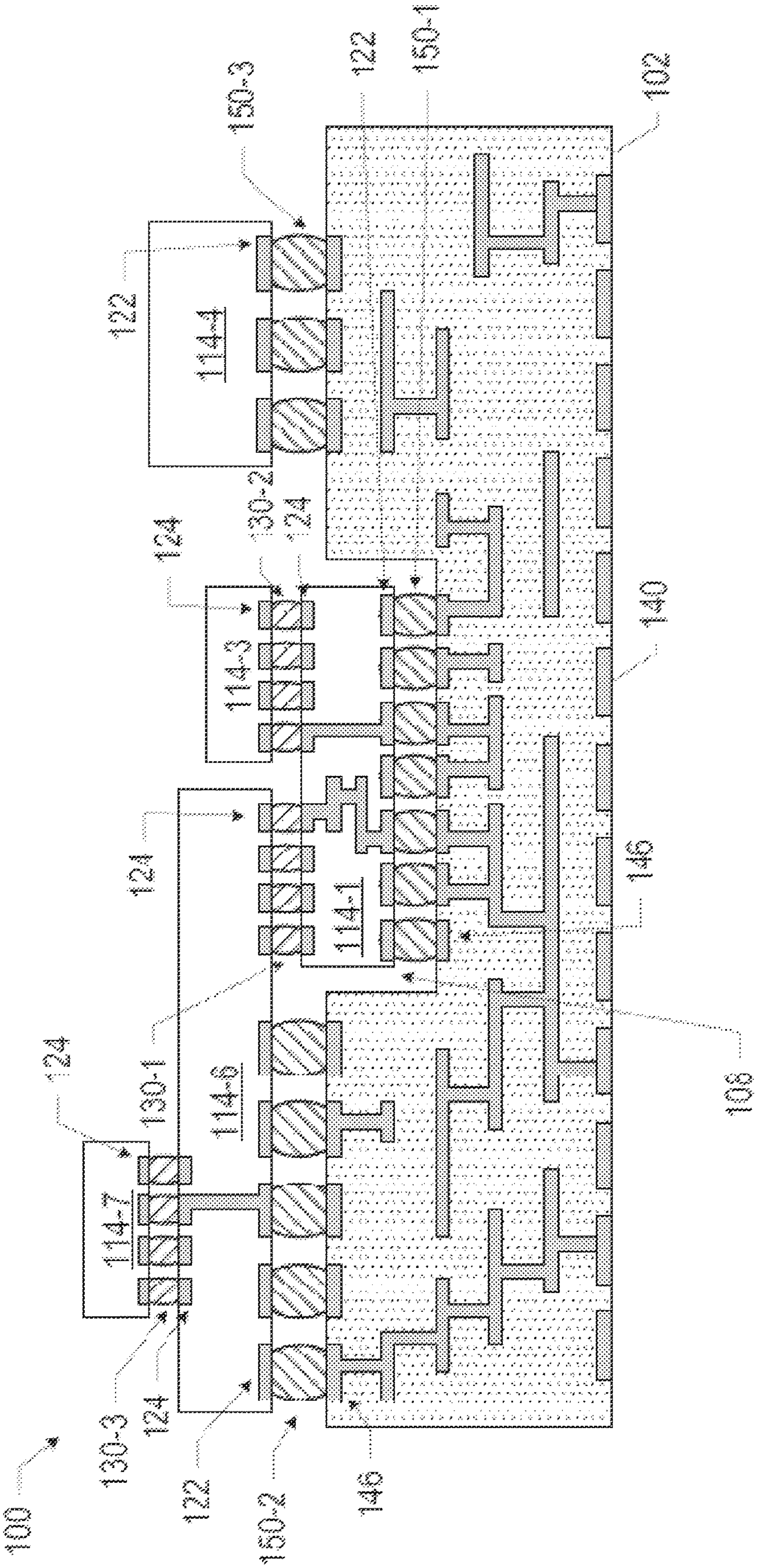

As noted above, any suitable number of the dies 114 in a microelectronic assembly 100 may be double-sided dies 114. For example, FIG. 6 illustrates a microelectronic assembly 100 sharing a number of elements with FIG. 1, but including a double-sided die 114-6. The die 114-6 includes conductive contacts 122 and 124 at its bottom surface; the conductive contacts 122 at the bottom surface of the die 114-6 are coupled to conductive contacts 146 at the top surface of the package substrate 102 via DTPS interconnects 150-2, and the conductive contacts 124 at the bottom surface of the die 114-6 are coupled to conductive contacts 124 at the top surface of the die 114-1 via DTD interconnects 130-1. The die 114-6 also includes conductive contacts 124 at its top surface; these conductive contacts 124 are coupled to conductive contacts 124 at the bottom surface of a die 114-7 by DTD interconnects 130-3.

Figure 7:
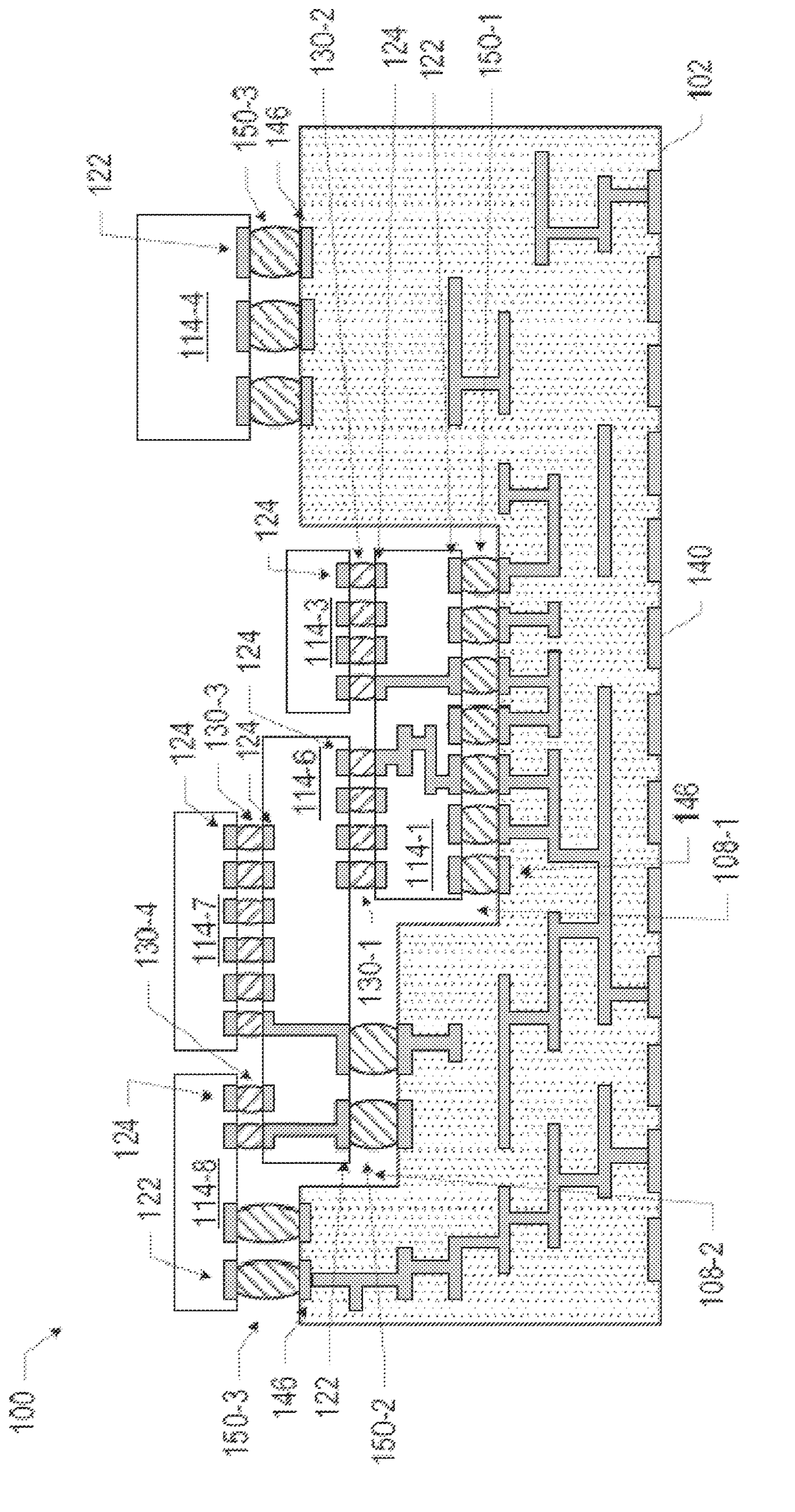

As noted above, a package substrate 102 may include one or more recesses 108 in which dies 114 are at least partially disposed. For example, FIG. 7 illustrates a microelectronic assembly 100 including a package substrate 102 having two recesses: a recess 108-1 and a recess 108-2. In the embodiment of FIG. 7, the recess 108-1 is nested in the recess 108-2, but in other embodiments, multiple recesses 108 need not be nested. In FIG. 7, the die 114-1 is at least partially disposed in the recess 108-1, and the dies 114-6 and 114-3 are at least partially disposed in the recess 108-2. In the embodiment of FIG. 7, like the embodiment of FIG. 6, the die 114-6 includes conductive contacts 122 and 124 at its bottom surface; the conductive contacts 122 at the bottom surface of the die 114-6 are coupled to conductive contacts 146 at the top surface of the package substrate 102 via DTPS interconnects 150-2, and the conductive contacts 124 at the bottom surface of the die 114-6 are coupled to conductive contacts 124 at the top surface of the die 114-1 via DTD interconnects 130-1. The die 114-6 also includes conductive contacts 124 at its top surface; these conductive contacts 124 are coupled to conductive contacts 124 at the bottom surface of a die 114-7 by DTD interconnects 130-3. Further, the microelectronic assembly 100 of FIG. 7 includes a die 114-8 that spans the package substrate 102 and the die 114-6. In particular, the die 114-8 includes conductive contacts 122 and 124 at its bottom surface; the conductive contacts 122 at the bottom surface of the die 114-8 are coupled to conductive contacts 146 at the top surface of the package substrate 102 via DTPS interconnects 150-3, and the conductive contacts 124 at the bottom surface of the die 114-8 are coupled to conductive contacts 124 at the top surface of the die 114-6 via DTD interconnects 130-4.

Figure 8:
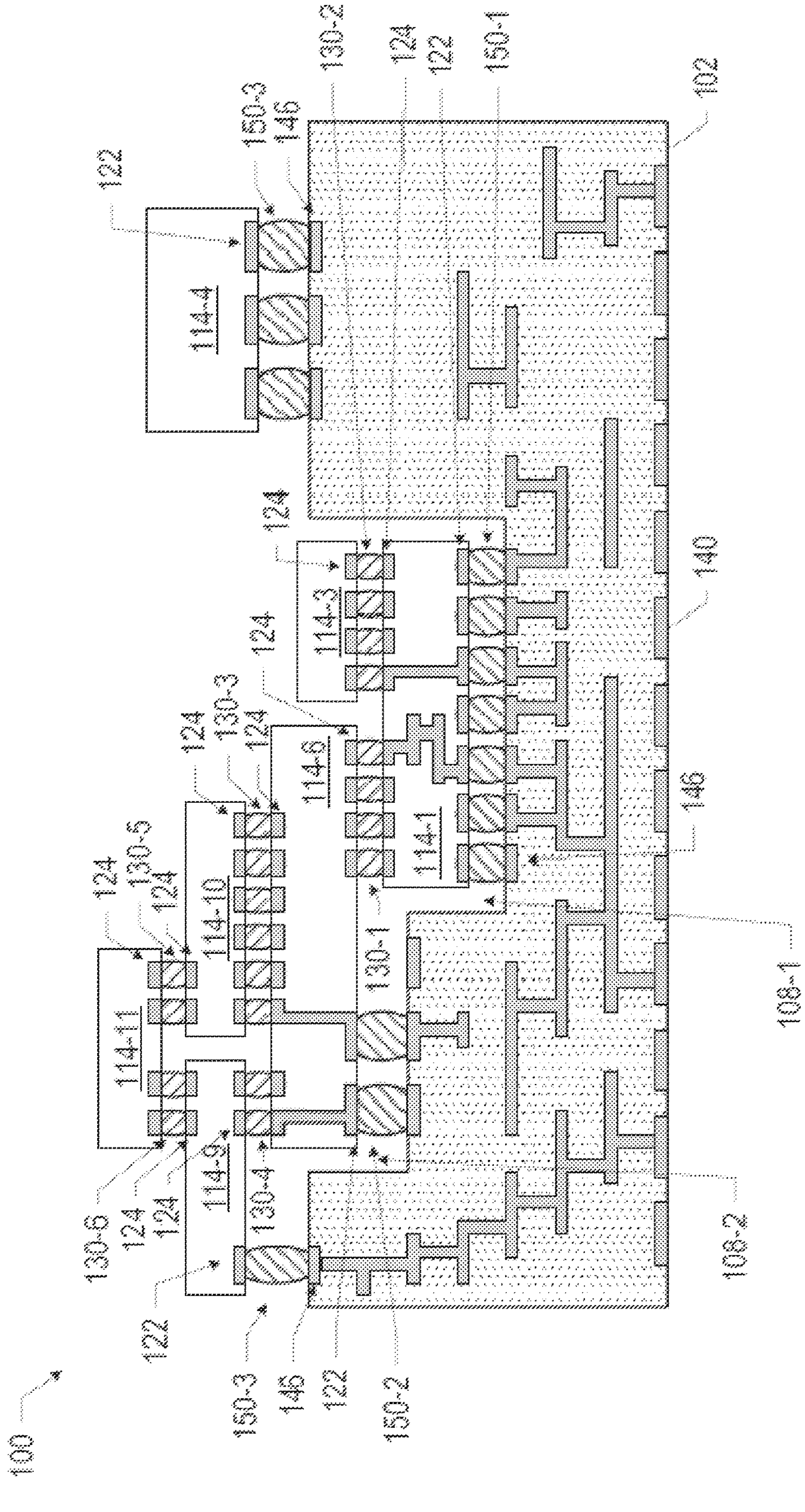

In various ones of the microelectronic assemblies 100 disclosed herein, a single die 114 may bridge to other dies 114 from "below" (e.g., as discussed above with reference to FIGS. 4 and 5) or from "above." For example, FIG. 8 illustrates a microelectronic assembly 100 similar to the microelectronic assembly 100 of FIG. 7, but including two double-sided dies 114-9 and 114-10, as well as an additional die 114-11. The die 114-9 includes conductive contacts 122 and 124 at its bottom surface; the conductive contacts 122 at the bottom surface of the die 114-9 are coupled to conductive contacts 146 at the top surface of the package substrate 102 via DTPS interconnects 150-3, and the conductive contacts 124 at the bottom surface of the die 114-9 are coupled to conductive contacts 124 at the top surface of the die 114-6 via DTD interconnects 130-4. The die 114-6 includes conductive contacts 124 at its top surface; these conductive contacts 124 are coupled to conductive contacts 124 at the bottom surface of a die 114-10 by DTD interconnects 130-3. Further, the die 114-11 includes conductive contacts 124 at its bottom surface; some of these conductive contacts 124 are coupled to conductive contacts 124 at the top surface of the die 114-9 by DTD interconnects 130-6, and some of these conductive contacts 124 are coupled to conductive contacts 124 at the top surface of the die 114-10 by DTD interconnects 130-5. The die 114-11 may thus bridge the dies 114-9 and 114-10.

Figure 9:
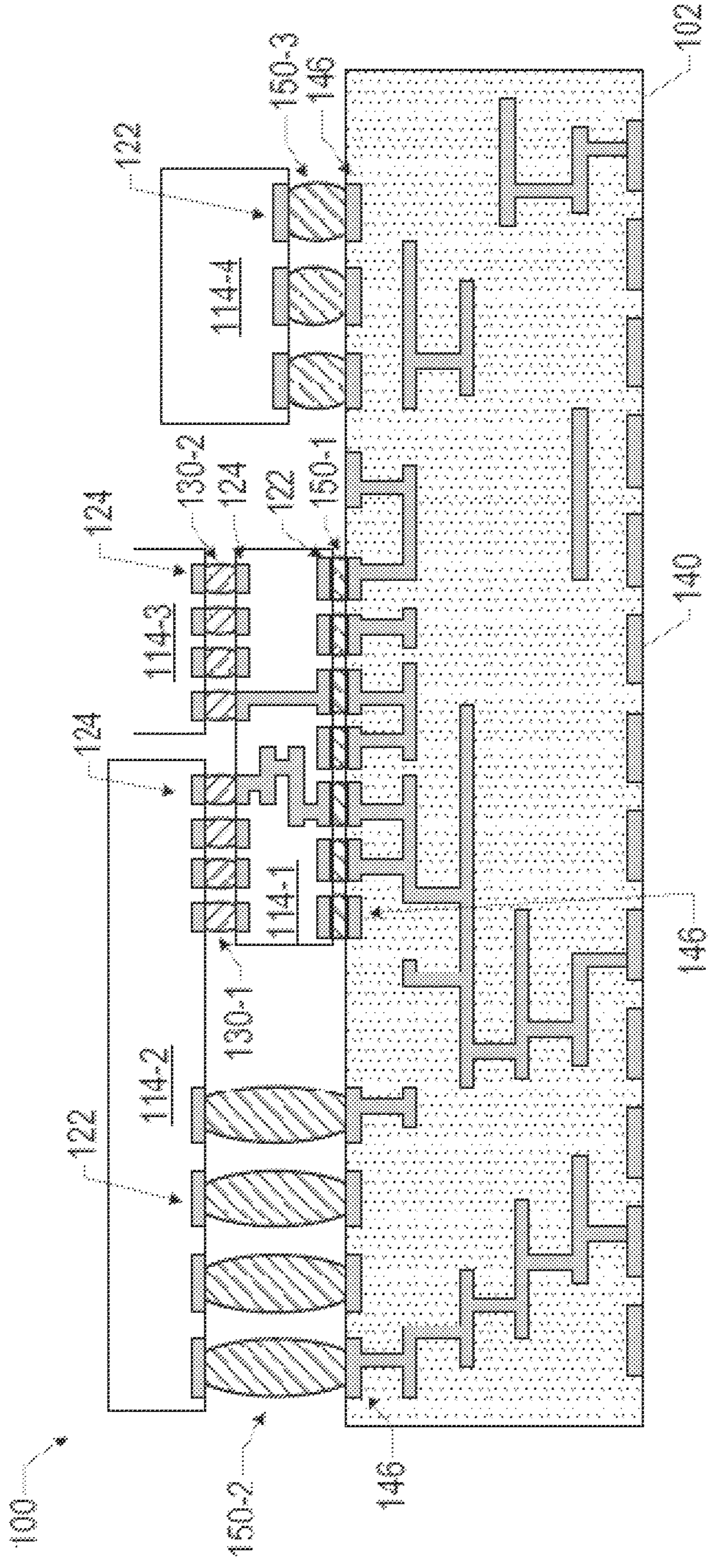
Figure 10:
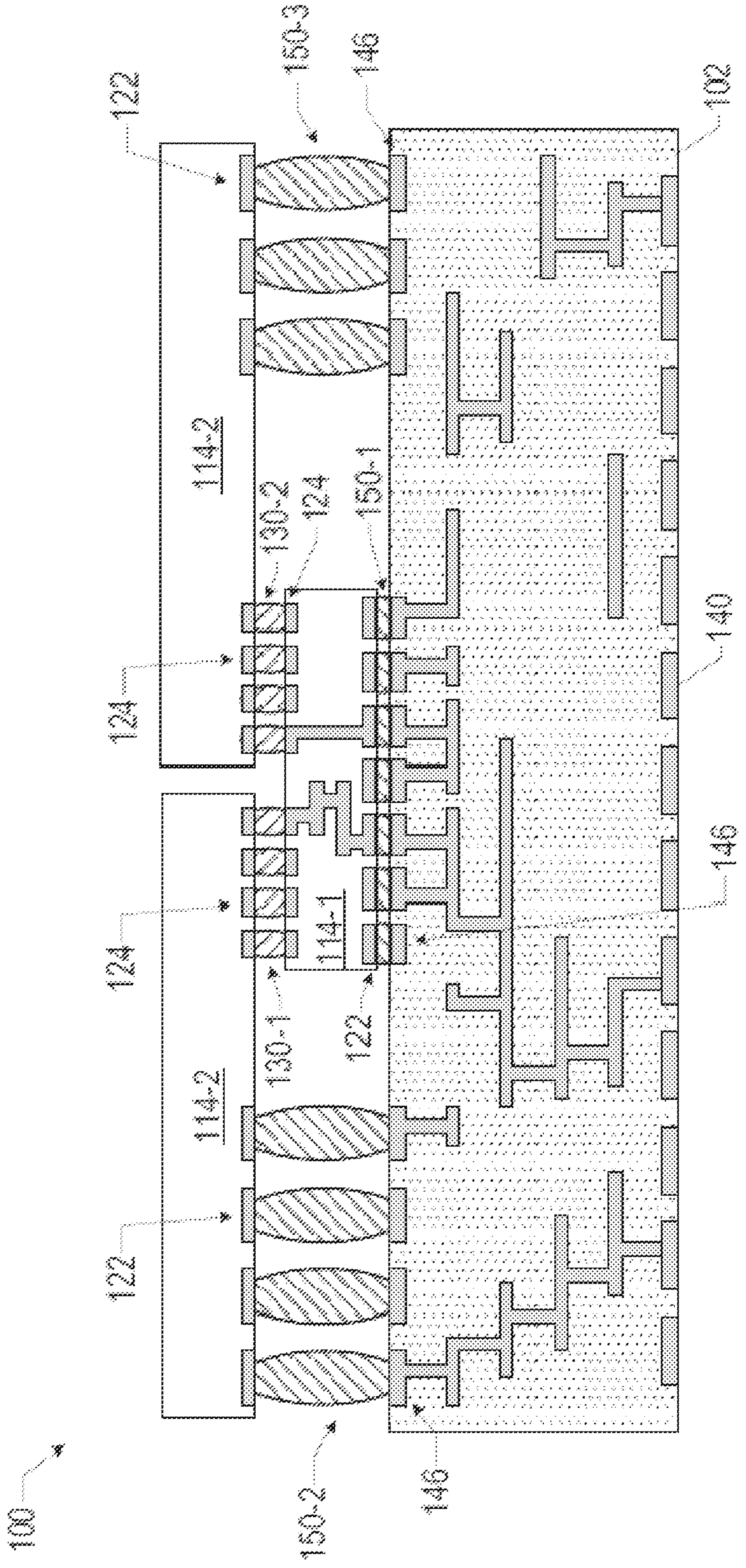

As noted above, in some embodiments, the package substrate 102 may not include any recesses 108. For example, FIG. 9 illustrates an embodiment having dies 114 and a package substrate 102 mutually interconnected in the manner discussed above with reference to FIG. 1, but in which the die 114-1 is not disposed in a recess in the package substrate 102. Instead, the dies 114 are disposed above a planar portion of the top surface of the package substrate 102. Any suitable ones of the embodiments disclosed herein that include recesses 108 may have counterpart embodiments that do not include a recess 108. For example, FIG. 10 illustrates a microelectronic assembly 100 having dies 114 and a package substrate 102 mutually interconnected in the manner discussed above with reference to FIG. 4, but in which the die 114-1 is not disposed in a recess in the package substrate 102.

Figure 11:
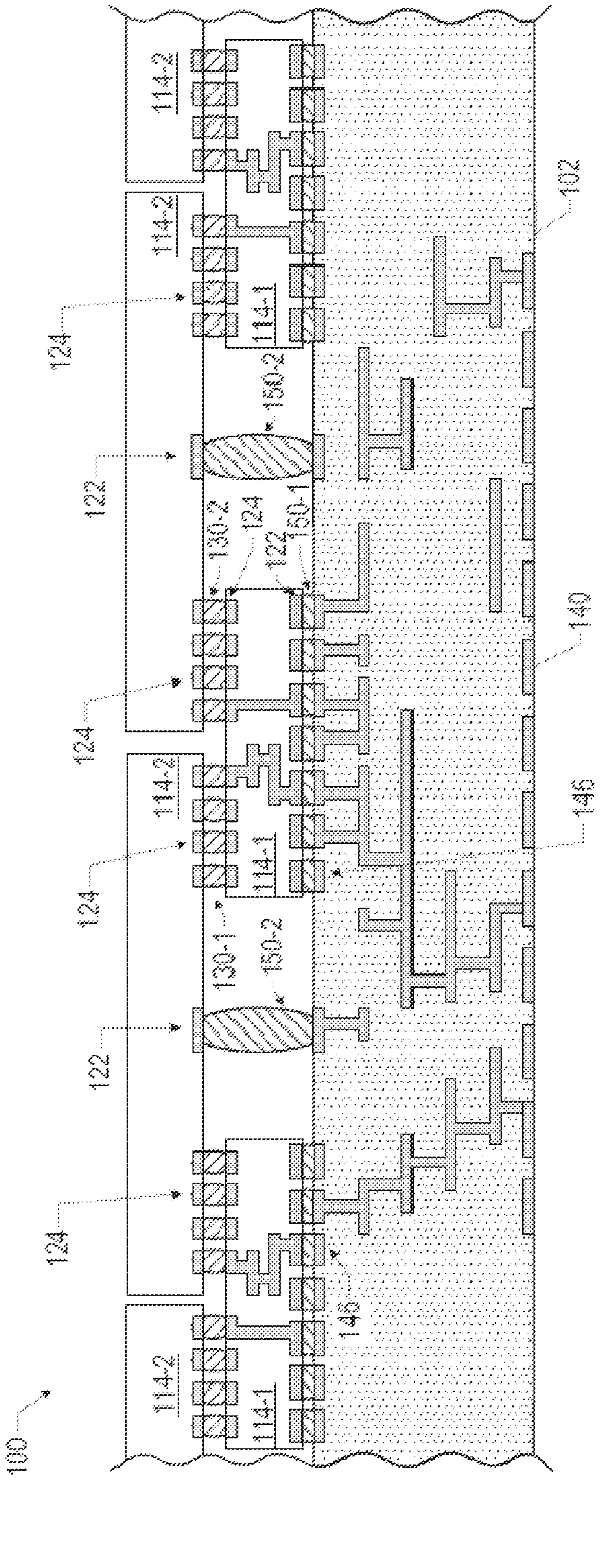

Any of the arrangements of dies 114 illustrated in any of the accompanying figures may be part of a repeating pattern in a microelectronic assembly 100. For example, FIG. 11 illustrates a portion of a microelectronic assembly 100 in which an arrangement like the one of FIG. 10 is repeated, with multiple dies 114-1 and multiple dies 114-2. The dies 114-1 may bridge the adjacent dies 114-2. More generally, the microelectronic assemblies 100 disclosed herein may include any suitable arrangement of dies 114. FIGS. 12-16 are top views of example arrangements of multiple dies 114 in various microelectronic assemblies 100, in accordance with various embodiments. The package substrate 102 is omitted from FIGS. 12-16; some or all of the dies 114 in these arrangements may be at least partially disposed in a recess 108 in a package substrate 102 or may not be disposed in a recess of a package substrate 102. In the arrangements of FIGS. 12-16, the different dies 114 may include any suitable circuitry. For example, in some embodiments, the die 114A may be an active or passive die, and the dies 114B may include input/output circuitry, high bandwidth memory, and/or enhanced dynamic random-access memory.

Figure 12:
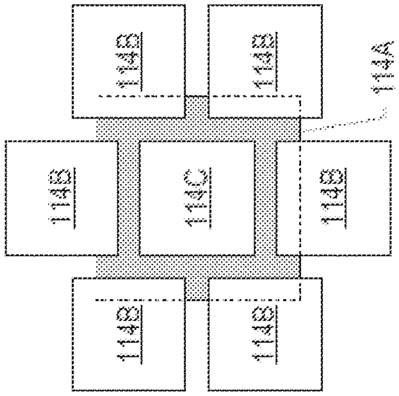

FIG. 12 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). FIG. 12 also illustrates a die 114C disposed on the die 114A (e.g., in the manner disclosed herein with reference to the die 114-3). In FIG. 12, the dies 114B "overlap" the edges and/or the corners of the die 114A, while the die 114C is wholly above the die 114A. Placing dies 114B at least partially over the corners of the die 114A may reduce routing congestion in the die 114A and may improve utilization of the die 114A (e.g., in case the number of input/outputs needed between the die 114A and the dies 114B is not large enough to require the full edge of the die 114A). In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108.

Figure 13:
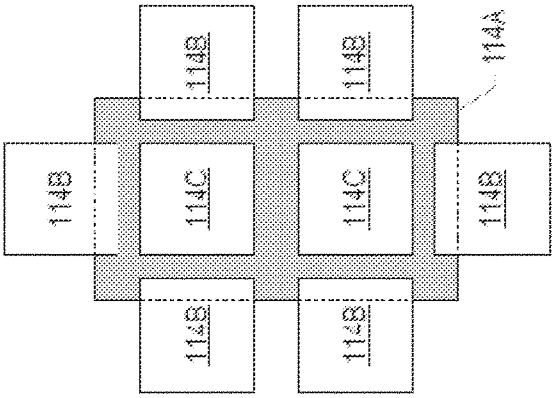

FIG. 13 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). FIG. 13 also illustrates dies 114C disposed on the die 114A (e.g., in the manner disclosed herein with reference to the die 114-3). In FIG. 13, the dies 114B "overlap" the edges of the die 114A, while the dies 114C are wholly above the die 114A. In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108. In the embodiment of FIG. 13, the dies 114B and 114C may be arranged in a portion of a rectangular array. In some embodiments, two dies 114A may take the place of the single die 114A illustrated in FIG. 13, and one or more dies 114C may "bridge" the two dies 114A (e.g., in the manner discussed below with reference to FIG. 15).

Figure 14:
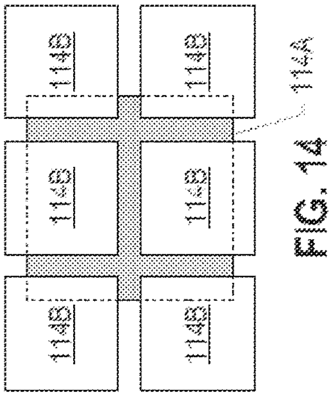
FIGS. 12-16 are top views of example arrangements of multiple dies in a microelectronic assembly, in accordance with various embodiments.

FIG. 14 illustrates an arrangement in which a die 114A is disposed below multiple different dies 114B. The die 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 14, the dies 114B "overlap" the edges and/or the corners of the die 114A. In some embodiments, the die 114A may be disposed in a recess 108 in a package substrate 102. In some embodiments, the die 114A may be disposed in a recess 108 in a package substrate 102, and the dies 114B may be disposed in one or more recesses 108 in the package substrate 102. In some embodiments, none of the dies 114A or 114B may be disposed in recesses 108. In the embodiment of FIG. 14, the dies 114B may be arranged in a portion of a rectangular array.

Figure 15:
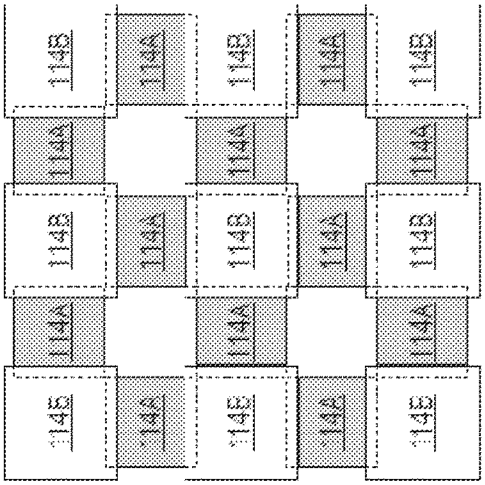

FIG. 15 illustrates an arrangement in which multiple dies 114A are disposed below multiple different dies 114B such that each die 114A bridges two or more horizontally or vertically adjacent dies 114B. The dies 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 12, the dies 114B "overlap" the edges of the adjacent dies 114A. In some embodiments, the dies 114A may be disposed in one or more recesses 108 in a package substrate 102. In some embodiments, the dies 114A may be disposed in one or more recesses 108 in a package substrate 102, and the dies 114B may be disposed in one or more recesses 108 in the package substrate 102. In some embodiments, none of the dies 114A or 114B may be disposed in recesses 108. In FIG. 15, the dies 114A and the dies 114B may be arranged in rectangular arrays.

Figure 16:
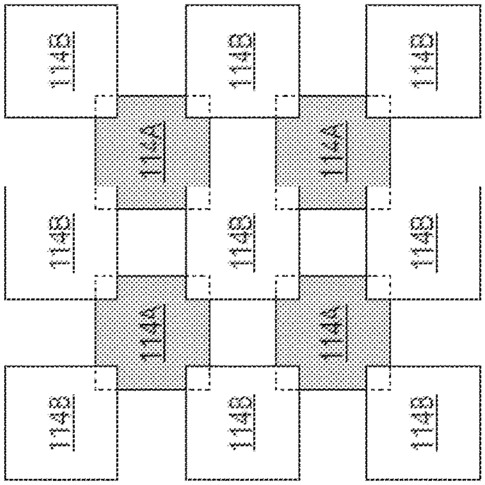

FIG. 16 illustrates an arrangement in which multiple dies 114A are disposed below multiple different dies 114B such that each die 114A bridges the four diagonally adjacent dies 114B. The dies 114A may be connected to a package substrate 102 (not shown) in any of the manners disclosed herein with reference to the die 114-1, while the dies 114B may span the package substrate 102 and the die 114A (e.g., in any of the manners disclosed herein with reference to the die 114-2). In FIG. 12, the dies 114B "overlap" the corners of the adjacent dies 114A. In some embodiments, the dies 114A may be disposed in one or more recesses 108 in a package substrate 102. In some embodiments, the dies 114A may be disposed in one or more recesses 108 in a package substrate 102, and the dies 114B may be disposed in one or more recesses 108 in the package substrate 102. In some embodiments, none of the dies 114A or 114B may be disposed in recesses 108. In FIG. 16, the dies 114A and the dies 114B may be arranged in rectangular arrays.

In some deployment scenarios, different ones of the dies 114 may be manufactured by different foundries and/or according to different manufacturing technologies for better performance, optimized yield, cost, or accelerated ramp, and later assembled into a single microelectronic assembly 100 according to any embodiments described above. In such scenarios, any one of the dies 114 may be fabricated using hybrid integration of BEOL layers for disaggregated technologies according to a method 200 of FIG. 17. FIGS. 18A-18J illustrates cross-sectional side views of example IC dies after various processes of the method 200 of FIG. 17, in accordance with various embodiments. Some of the elements shown in FIGS. 18A-18J are referred in the present description with reference numerals illustrated in these drawings with different patterns, with a legend showing the correspondence between the reference numerals and patterns being provided at the bottom of each drawing page of FIGS. 18A-18J. Although a certain number of a given element may be illustrated in FIGS. 18A-18J (e.g., a certain number of conductive contacts or a certain number of conductive pathways), this is also simply for ease of illustration, and more, or less, than that number may be included in IC dies according to various embodiments of the present disclosure.

Figure 17:
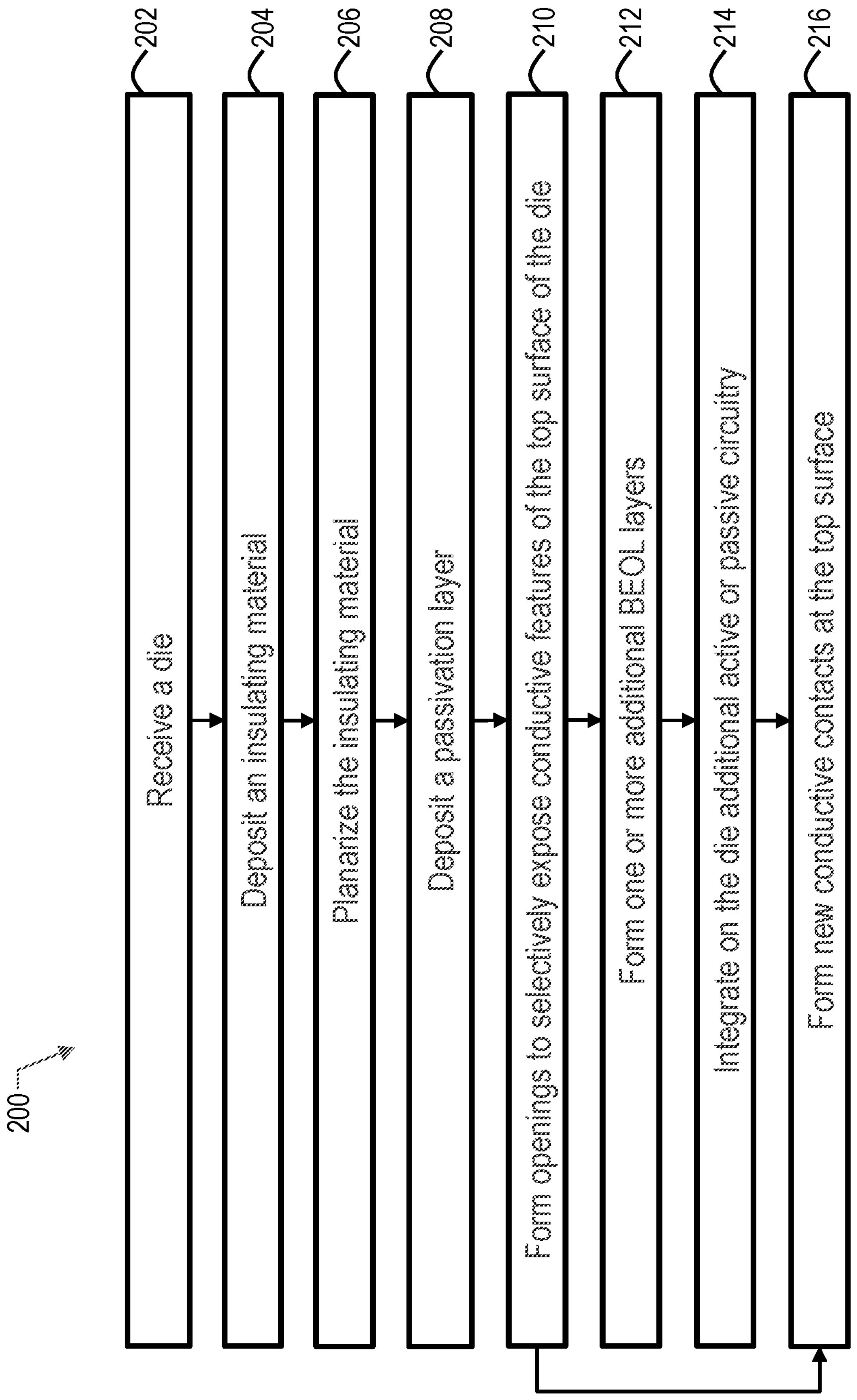
FIG. 17 is a flow diagram of an example method of manufacturing an IC die using hybrid integration of BEOL layers for disaggregated technologies, in accordance with various embodiments.

Although the operations of the manufacturing method illustrated in FIG. 17 are illustrated once each and in a particular order, the operations may be performed in any suitable order and repeated as desired. For example, the operations may be performed in a different order to reflect the structure of a microelectronic assembly 100 in which an IC die fabricated using the method 200 will be included. In addition, the example manufacturing method illustrated in FIG. 17 may include other operations not specifically shown in the drawings, such as various cleaning operations as known in the art. For example, in some embodiments, the die surface that is being processed may be cleaned prior to, after, or during any of the processes of the manufacturing method illustrated in FIG. 17, e.g., to remove oxides, surface-bound organic and metallic contaminants, as well as subsurface contamination. In some embodiments, cleaning may be carried out using, e.g., a chemical solution (such as peroxide), and/or ultraviolet (UV) radiation combined with ozone, and/or oxidizing the surface (e.g., using thermal oxidation) then removing the oxide (e.g., using hydrofluoric acid (HF)).

Figure 18A:
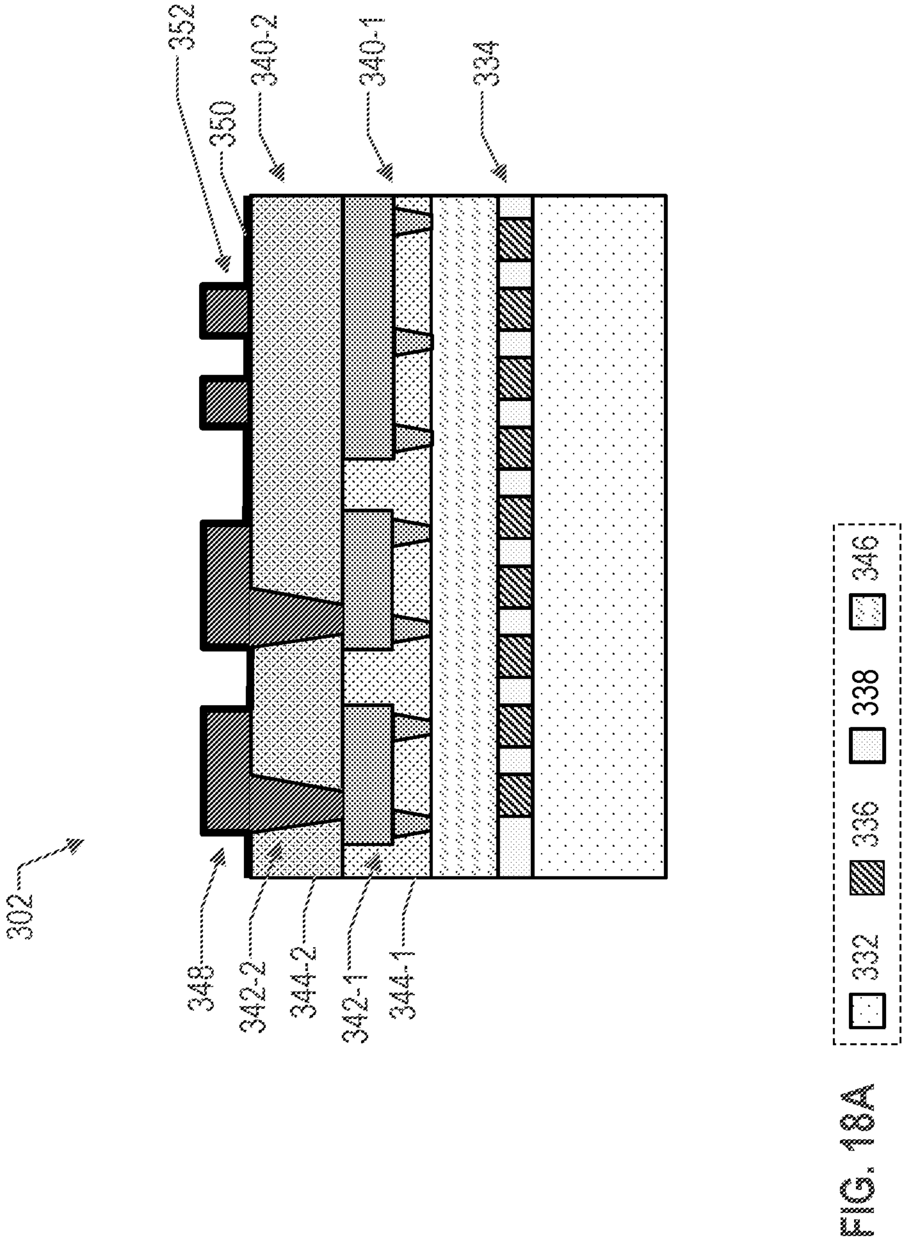
FIGS. 18A-18J illustrates cross-sectional side views of example IC dies after various processes of the method of FIG. 17, in accordance with various embodiments.

Turning to the method 200, at 202, a die may be received. A die 302, depicted in FIG. 18A, illustrates an example of a die that may be received at 202. As shown in FIG. 18A, the die 302 may include a base 332 and an FEOL layer 334 over the base, the FEOL layer including active or passive circuitry 336 (e.g., transistors, diodes, resistors, inductors, and capacitors, among others), electrically isolated from one another by an insulating material 338. The base 332 may be a die substrate, e.g., a die substrate 1602 described with reference to FIG. 20. The FEOL layer 334 may include one or more device layers disposed on the die substrate, e.g., one of more device layers 1604 described with reference to FIG. 20.

The die 302 may further include a first BEOL layer 340-1 over the FEOL layer 334 and a second BEOL layer 340-2 over the first BEOL layer 340-2 (together, the first and second BEOL layers 340-1 and 340-2, as well as additional BEOL layers 340-3, 340-4, etc., shown in subsequent drawings, may be referred to as "BEOL layers 340"). The first BEOL layer 340-1 may include a plurality of first conductive pathways 342-1 in a first insulating material 344-1, while the second BEOL layer 340-2 may include a plurality of second conductive pathways 342-2 in a first insulating material 344-2 (together, the first and second conductive pathways 342-1 and 342-2, as well as additional conductive pathways 342-3, 342-4, etc., shown in subsequent drawings, may be referred to as "conductive pathways 342," while the first and second insulating materials 344-1 and 344-2, as well as additional insulating materials 344-3, 344-4, etc., shown in subsequent drawings, may be referred to as "insulating materials 344"). Any of the conductive pathways 342 may include conductive traces and/or conductive vias, e.g., such as lines 1628*a* and/or vias 1628*b* described with reference to FIG. 20. It should be noted that the first BEOL layer 340-1 is not necessarily the very first BEOL layer 340-1 above the FEOL layer 334, but that the terminology "first" merely represents a BEOL layer that is closer to the base 332 than the top BEOL layer of the die 302 received at 202, where the top BEOL layer is the "second" BEOL layer 340-2. To that end, FIG. 18A further illustrates that the die 302 may include a further layer 346 between the FEOL layer 334 and the first BEOL layer 340-1, where the further layer 346 may include one or more additional BEOL layers. The BEOL layers 340 and the further layer 346 may be implemented similar to interconnect layers disposed on the device layer, e.g., as interconnect layers 1606-1610 disposed on the one or more device layers 1604 as described with reference to FIG. 20.

The top BEOL layer of the die 302 received at 202, i.e., the second BEOL layer 340-2, may include various conductive features protruding from the top surface of the second insulating material 344-2. One example of such conductive features, shown in FIG. 18A, are conductive contacts 348. Typically, the die 302 would be received at 202 with a passivation layer 350 provided over all conductive features of the top surface of the die 302, where the passivation layer 350 may include materials such as silicon oxide, silicon nitride, or silicon oxynitride. FIG. 18A further illustrates that, in some embodiments, conductive features protruding from the top surface of the second insulating material 344-2 may also include conductive traces 352, in which case the passivation layer 350 would be provided over the top of the conductive traces 352 as well.

The die 302 may be an example of a portion of any of the dies 114 of the microelectronic assembly 100, where the conductive pathways 342 may take form of any of the conductive pathways to route power, ground, and/or signals to various components of the die 302 (e.g., to the active or passive circuitry 336), to/from other dies, and/or to/from other components of the microelectronic assembly 100 (e.g., to/from the package substrate 102) as described above. For example, the conductive pathways 342 may include TSVs, including a conductive material via, such as a metal via, isolated from the surrounding silicon or other semiconductor material by a barrier oxide, or other conductive pathways through which power, ground, and/or signals may be transmitted in/through the die 302. The conductive pathways 342 may be formed of any appropriate conductive material, such as copper, silver, nickel, gold, aluminum, or other metals or alloys, for example. In some embodiments, the conductive pathways 342 in different BEOL layers 340 may be formed of different conductive materials; e.g., in some embodiments, the first conductive pathways 342-1 may be formed of copper, while the second conductive pathways 342-2 may be formed of aluminum. Similarly, the insulating materials 344 in different BEOL layers 340 may be same or different insulating materials, and may include any of the insulating materials typically used as interlayer dielectric (ILD) materials, such as low-k and ultra low-k dielectrics (e.g., carbon-doped dielectrics, fluorine-doped dielectrics, porous dielectrics, and organic polymeric dielectrics).

The conductive contacts 348 may be implemented similar to any of the conductive contacts of the microelectronic assembly 100, described above, such as the conductive contacts 122, 124, etc. For example, in some embodiments, the conductive contacts 348 may be implemented as conductive pads or sockets. Although FIG. 18A illustrates each of the conductive contacts 348 being coupled to one of the conductive pathways 342, this need not be the case for all embodiments of the die 302. In some embodiments, one or more of the conductive contacts 348 may be so-called "dummy conductive contacts" or "no-connect conductive contacts" because they are not electrically connected to any of the conductive pathways 342 and, hence, are electrically isolated from all components of the die 302. Such dummy conductive contacts may sometimes be implemented in the die 302 in order to ensure that certain pad density rules are met.

Figure 18B:
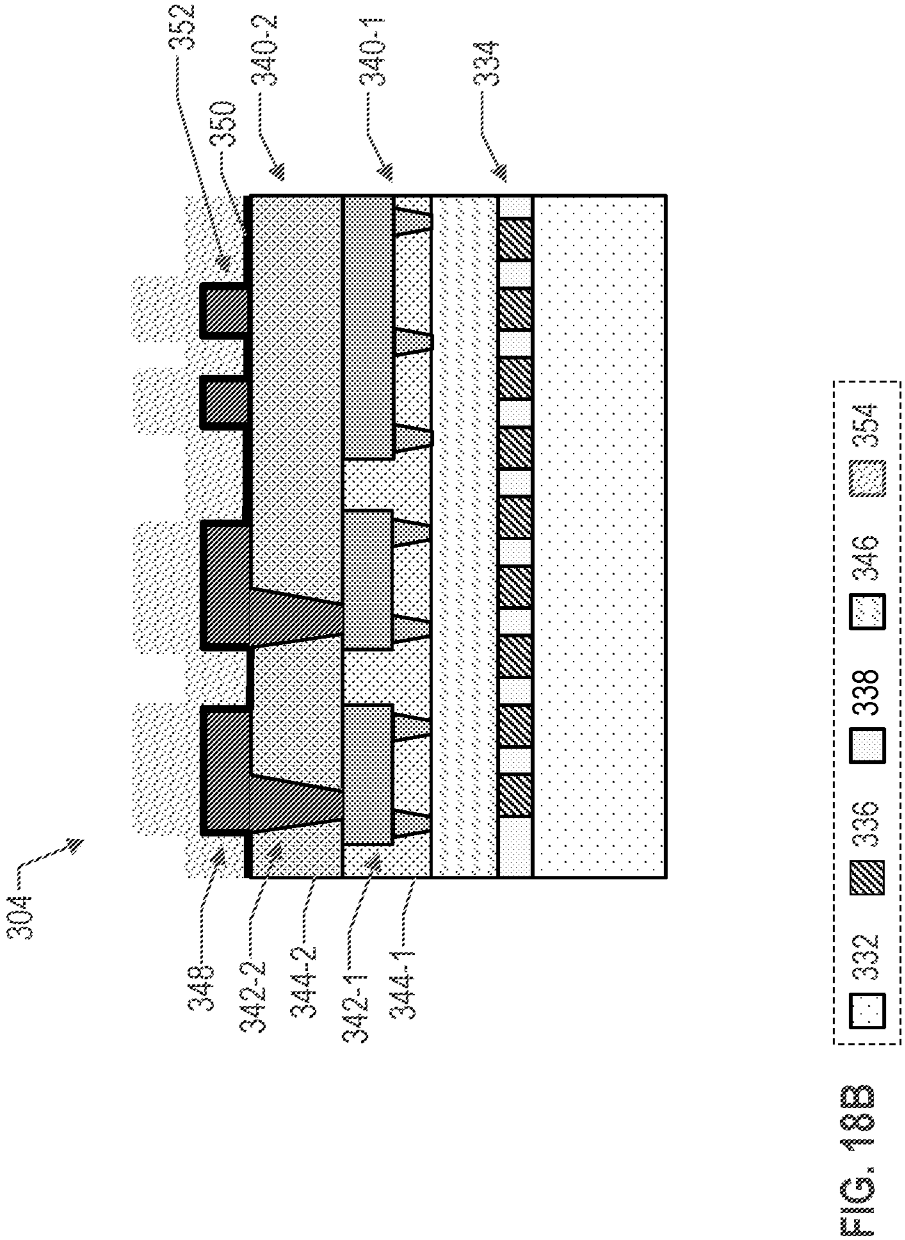

Once the die 302 received at 202 is cleaned, the method 200 may proceed with 204, in which an insulating material is deposited over the top surface of the die 302. A die 304, depicted in FIG. 18B, illustrates an example of the die 302 with an insulating material 354 deposited on top. The insulating material 354 may be deposited at 204 using any suitable deposition techniques such as atomic level deposition (ALD), chemical vapor deposition (CVD), physical vapor deposition (PVD), etc. The insulating material 354 may include any of the insulating materials typically used as ILD materials, e.g., a silicon oxide. In general, the insulating material 354 may be substantially the same material as the insulating material 344-2 or the insulating material 344-1, e.g., all of these could include silicon oxide. However, because it is deposited at a different place compared to where the insulating materials 344-1 and 344-2 were deposited (e.g., at a different foundry or a different other manufacturer), it may be difficult to match the exact material composition and material characteristics even if the same namesake material is used. Therefore, one characteristic feature indicative of the method 200 may be that the insulating material 354 has different density, porosity, compressive vs. tensile stress, or other material characteristics compared to the insulating materials 344-1 and 344-2. For example, in some embodiments, the density of the insulating material 354 may differ by at least about 2% (e.g., by at least about 5%) from the density of the insulating material 344-2.

In some embodiments, any one of the porosity, compressive stress, or tensile stress of the insulating material 354 may differ by at least about 2% (e.g., by at least about 5%) from the corresponding characteristic of the insulating material 344-2.

Figure 18C:
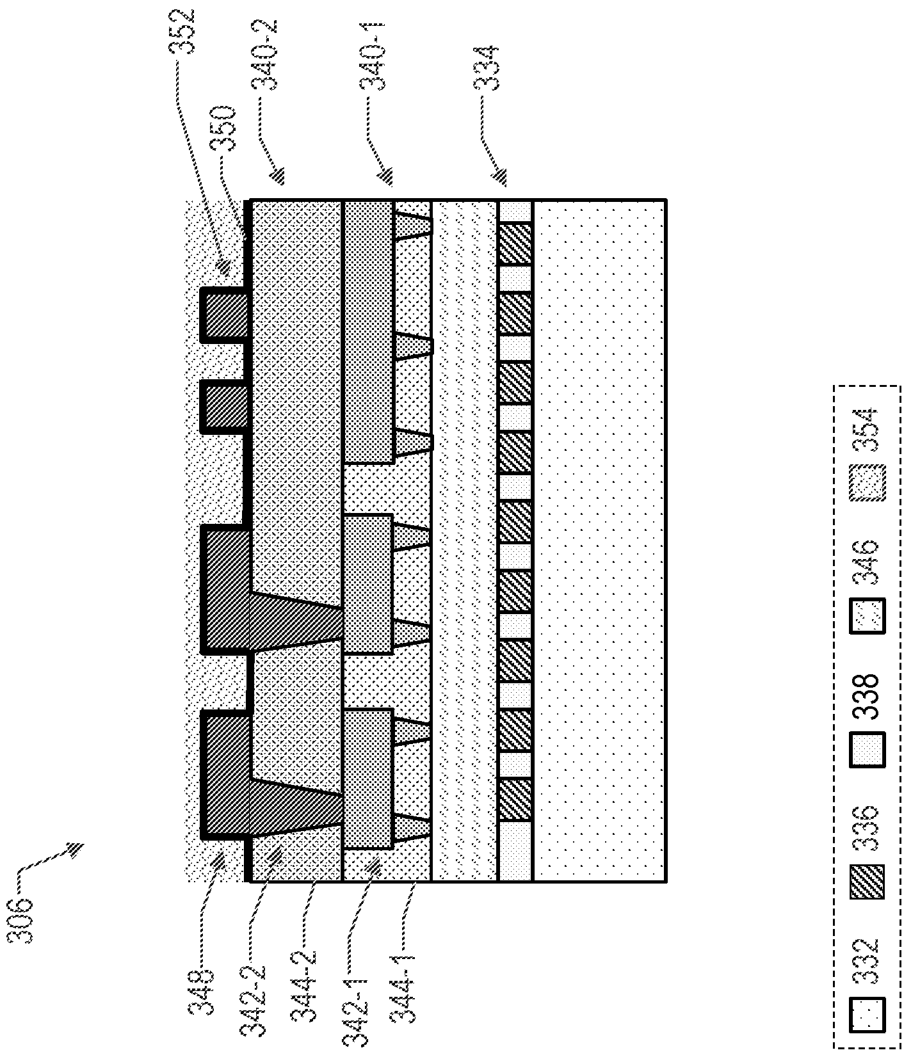

At 206, the insulating material is deposited at 204 may be planarized. A die 306, depicted in FIG. 18C, illustrates an example of the die 304 for which the insulating material 354 deposited at 204 has been planarized. The planarization performed at 206 may include any suitable process for removing overburden or excess of the insulating material 354. In some embodiments, planarization may be carried out at 206 using either wet or dry planarization processes, e.g., planarization be a chemical mechanical planarization (CMP), which may be understood as a process that utilizes a polishing surface, an abrasive and a slurry to remove the overburden and planarize the surface of the insulating material 354. FIG. 18C illustrates an embodiment where, as a result of the planarization of the process 206, some of the insulating material 354 remains on the top of (i.e., covering) all of the features of the die 302, e.g., on top of the conductive contacts 348 and, if present, on top of the conductive traces 352.

Figure 18D:
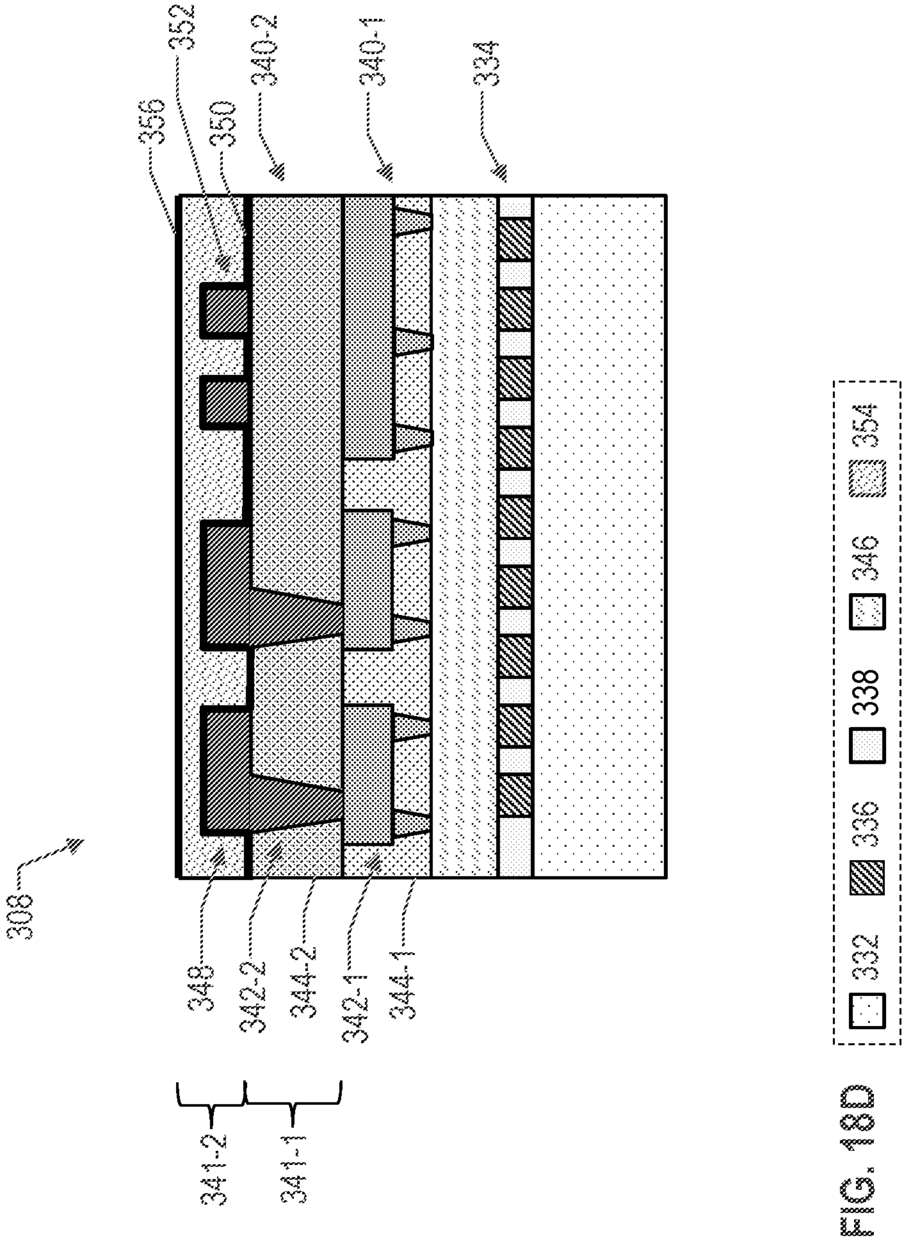

At 208, a passivation layer may be deposited over the planarized insulating material. A die 308, depicted in FIG. 18D, illustrates an example of the die 306 with a passivation layer 356 deposited over the planar surface of the insulating material 354. The passivation layer 356 may be deposited at 208 using any suitable deposition techniques such as ALD, CVD, PVD, etc., and may include any of the materials described with reference to the passivation layer 350. However, because the passivation layer 356 is deposited at a different place compared to where the passivation layer 350 was deposited (e.g., at a different foundry or a different other manufacturer), it may be difficult to match the exact material composition and material characteristics even if the same namesake material is used. Therefore, another characteristic feature indicative of the method 200 may be that the passivation layer 356 may be different from the passivation layer 350 in one or more of stochiometry, density, porosity, compressive stress, or tensile stress, e.g., at least about 2% different or at least about 5% different. The flat, passivated surface of the die 308, produced at the end of 208, may then serve as a fundamental building block in performing further processing of the die. From here on, further processing may include one or more of formation of additional BEOL layers, integration of other active or passive circuitry (e.g., capacitors) over the top surface of the die 308, and formation of new top conductive contacts, as needed for a particular deployment scenario. Formation of a flat, passivated surface even though the die may be originally received with a surface with conductive features protruding from it (e.g., as is the case for the die 302) may be particularly advantageous for foundries or manufacturers that have fabrication processes designed to start with a die with a flat surface.

After the flat surface is formed at the end of 208, the second BEOL layer 340-2 may be seen as including a first sub-layer 341-1 and a second sub-layer 341-2. The first sub-layer 341-1 is a portion of the second BEOL layer 340-2 that includes second conductive pathways 342-2 surrounded by the second insulating material 344-3, while the second sub-layer 341-2 is a portion of the second BEOL layer 340-2 that includes conductive features that were protruding from the surface of the die 302 (e.g., the conductive contacts 348 and conductive traces 352) surrounded by the insulating material 354.

Figure 18E:
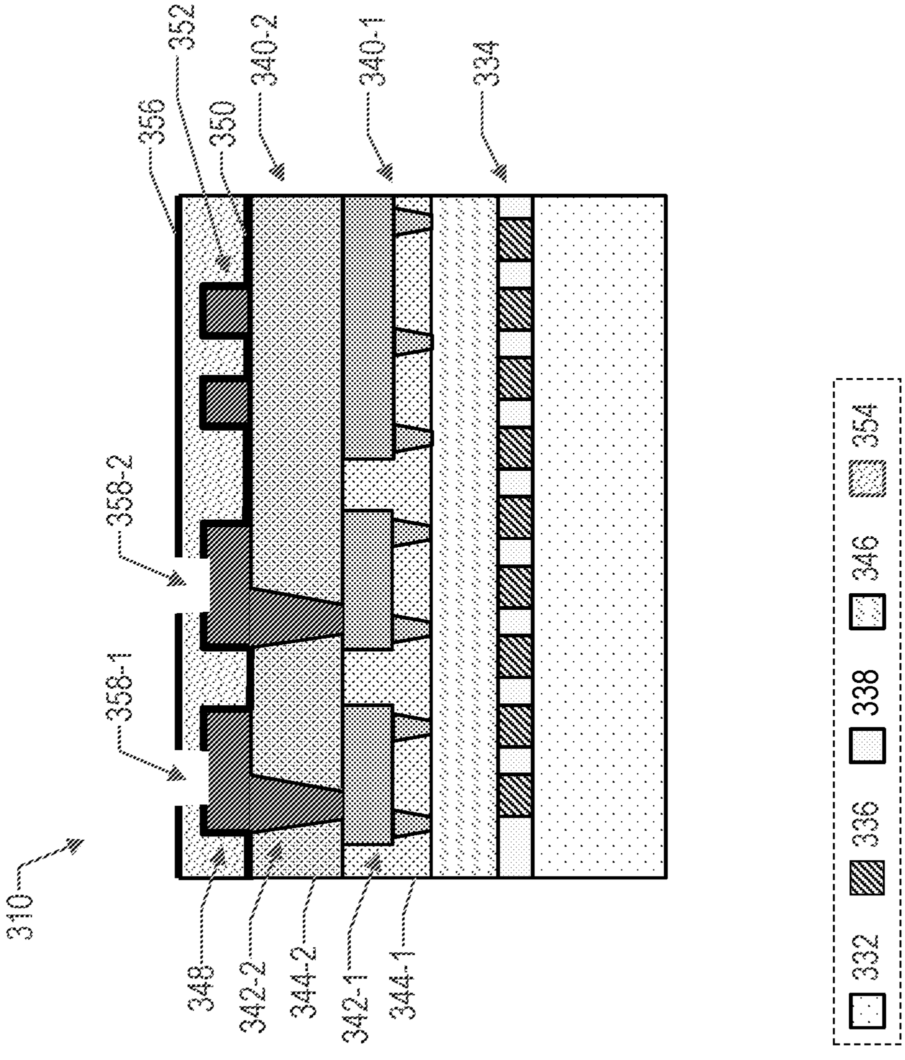

From 208, the method 200 may proceed with 210, which includes forming one or more openings in the passivation layer 356 and the insulating material 354 to selectively expose (i.e., expose as needed) conductive features of the top surface of the die that was received at 202. A die 310, depicted in FIG. 18E, illustrates an example of the die 308 for which a first opening 358-1 and a second opening 358-2 (together, referred to as "openings 358") are formed to expose the conductive contacts 348. Although not specifically shown in the present drawings, in other embodiments, 210 may include forming openings to expose any of the conductive traces 352 and/or exposing only some but not all of the conductive contacts 348. Exposing the conductive features of the die received at 202 includes at least removing portions of the passivation layer 356 and the passivation layer 350; if any of the insulating material 354 remains over the top of the conductive features after the insulating material 354 is planarized at 206, then forming the openings 358 at 210 further includes removing portions of the insulating material 354 that was remaining over the top of the conductive features. In various embodiments, any suitable etching techniques may be used at 210, possibly in combination with patterning, to form the openings 358. Some examples of etching techniques that may be used at 210 include, but are not limited to, any suitable anisotropic etch techniques such as a dry etch, e.g., radio frequency (RF) reactive ion etch (RIE) or inductively coupled plasma (ICP) RIE. In some embodiments, the etch performed in the process 210 may include an anisotropic etch using etchants in a form of e.g., chemically active ionized gas (i.e., plasma) using e.g., bromine (Br) and chloride (Cl) based chemistries. In some embodiments, during the etch of the process 210, the die may be heated to elevated temperatures, e.g., to temperatures between about room temperature and 200 degrees Celsius, including all values and ranges therein, to promote that byproducts of the etch are made sufficiently volatile to be removed from the surface. Some examples of patterning techniques that may be used at 210 include, but are not limited to, lithographic patterning or electron-beam patterning, possibly in combination with suitable masks.

The openings 358 formed at 210 may then be used to provide electrical connectivity between selective conductive features of the top surface of the die that was received at 202 (i.e., conductive features that were exposed by the openings 358 at 210) and additional components that may be provided over the top surface of the die 310. To that end, from 210, the method 200 may proceed with any one or more of processes 212, 214, and 216.

Figure 18F:
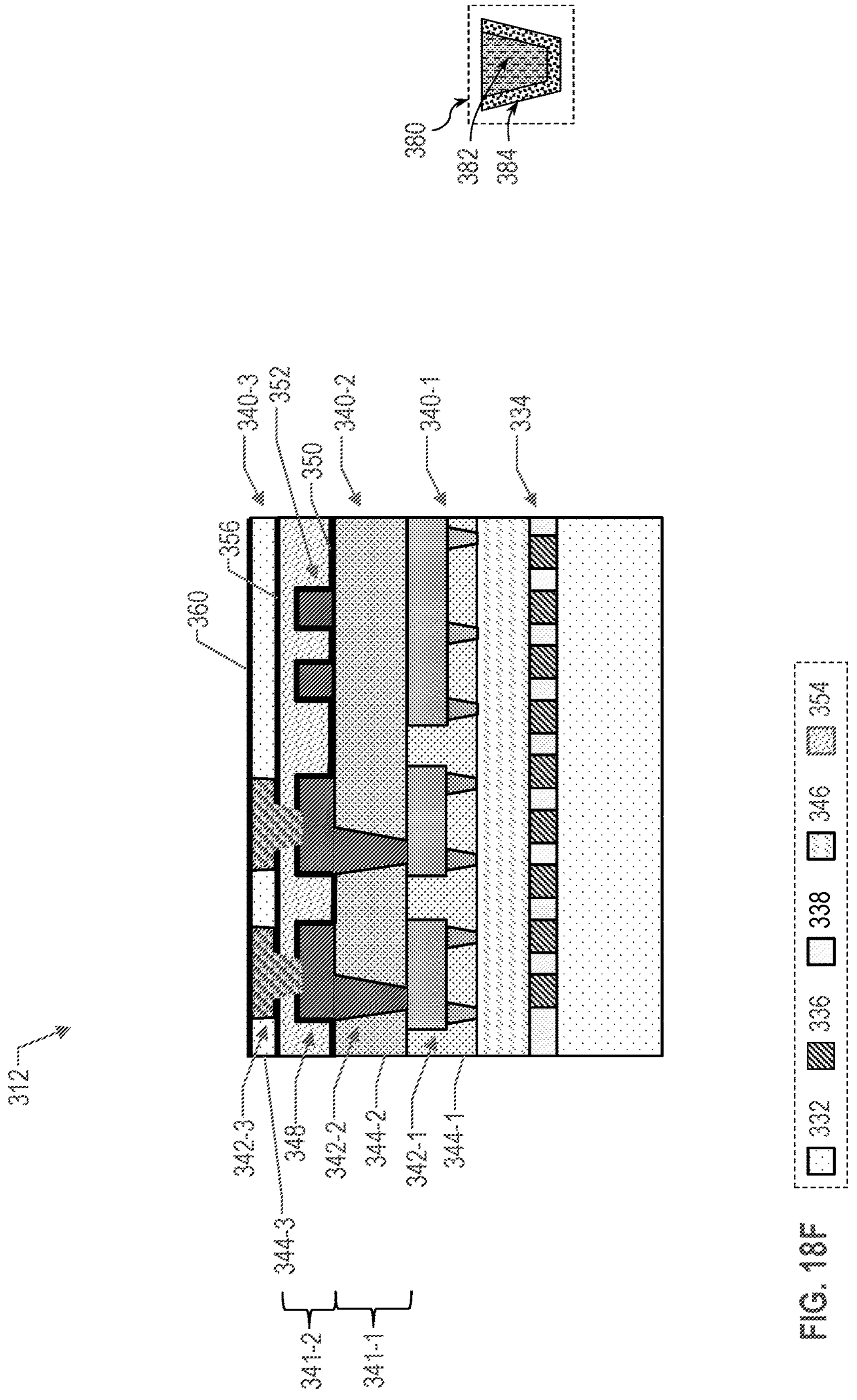

At 212, one or more additional BEOL layers may be formed over the top surface of the die resulting from the process 210. A die 312, depicted in FIG. 18F, illustrates an example of the die 310 over which a third BEOL layer 342-3 was formed at 212. The third BEOL layer 342-3 may include a plurality of third conductive pathways (e.g., conductive traces and/or conductive vias) 342-3 in a third insulating material 344-3, where at least some of the third conductive pathways 342-3 extend into the openings 358 formed at 210, to electrically connect to some conductive features of the top surface of the die that was received at 202, e.g., to route power, ground, and/or signals to/from these conductive features. For example, FIG. 18F illustrates that at least some of the third conductive pathways 342-3 may electrically connect (e.g., be in contact with) exposed portions of the conductive contacts 348. A passivation layer 360 may be provided over the top of the third BEOL layer 342-3. Any suitable deposition and patterning techniques as known in the art for forming BEOL layers may be used at 212 to provide one or more additional BEOL layers over the top surface of the die resulting from the process 210.

Figure 18G:
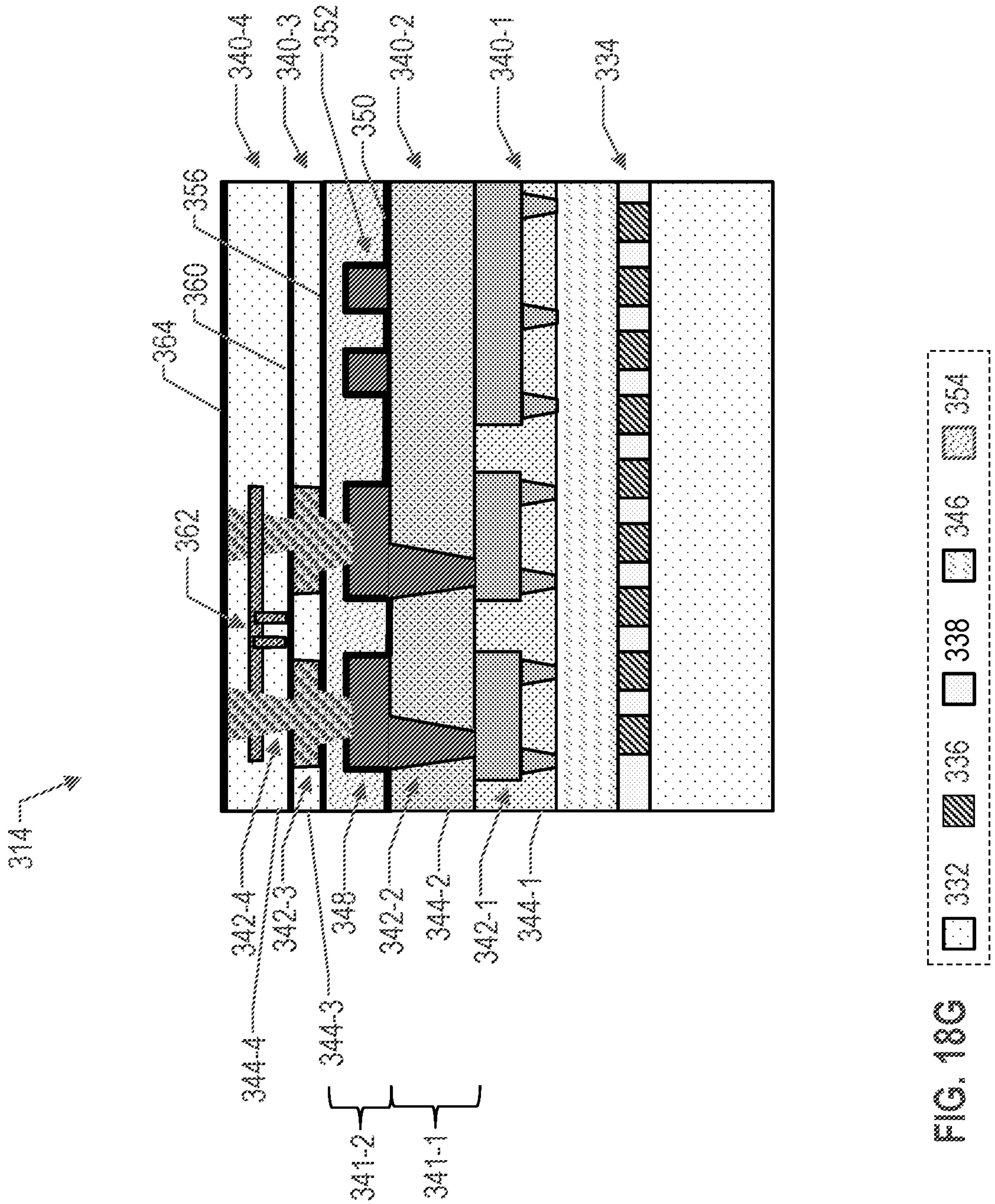

At 214, other active or passive circuitry (e.g., capacitors) may be integrated over the top surface of the die. A die 314, depicted in FIG. 18G, illustrates an example of the die 312 over which a fourth BEOL layer 342-4 was formed at 214, the fourth BEOL layer 342-4 containing a structure 362 representing, e.g., capacitors (e.g., metal-insulator-metal (MIM) capacitors) as an example of active or passive circuitry that may be integrated. The fourth BEOL layer 342-4 may include a plurality of fourth conductive pathways (e.g., conductive traces and/or conductive vias) 342-4 in a fourth insulating material 344-4. At least some of the fourth conductive pathways 342-4 may extend through the passivation layer 360 to electrically connect to some of the third conductive pathways 342-3 to route power, ground, and/or signals to/from the third conductive pathways 342-3. At least some of the fourth conductive pathways 342-4 may electrically connect to the structure 362 to route power, ground, and/or signals to/from the structure 362. A passivation layer 364 may be provided over the top of the fourth BEOL layer 342-4. Any suitable deposition and patterning techniques (e.g., any of those described above) for forming BEOL layers with active or passive circuitry may be used at 214 to integrate such circuitry over the top surface of the die resulting from the process 210 or the process 212. For example, in various embodiments, active or passive circuitry of the structure 362 may be fabricated using any suitable technique, e.g., Damascene, dual Damascene, semi-additive processing (SAP), or subtractive fabrication. Furthermore, the process 214 may include applying any suitable etching techniques (e.g., any of those described above) to form openings to expose underlying conductive structures to which the structures provided in the process 214 are to be electrically connected to. For example, the process 214 may include forming openings through the passivation layer 360 so that the fourth conductive pathways 342-4 and/or conductive portions of the structure 362 (e.g., capacitor electrodes) may be electrically connected to the third conductive pathways 342-3. Integrating the structure 362 containing additional active or passive circuitry may advantageously allow adding new functionality to the die 302 that was received from a given foundry or manufacturer or it may allow enhancing existing functionality. For example, adding capacitors in the form of the structure 362 to the back end of the die 314 may address the challenge of native MIM capacitance insufficiency that may exist for the die 302.

Although not specifically shown in the present drawings, in some embodiments, the method 200 may proceed to 214 directly from 210. In such embodiments, the fourth BEOL layer 340-4 with the structure 362 would be formed directly over the openings 358 formed at 210 and at least some of the fourth conductive pathways 342-4 would extend into the openings 358 to electrically connect to some conductive features of the top surface of the die that was received at 202, e.g., to route power, ground, and/or signals to/from these conductive features. However, it may be advantageous to include at least one intermediate BEOL layer (e.g., the third BEOL layer 340-3) between the fourth BEOL layer 340-4 with the structure 362 and the second sub-layer 341-2 of the second BEOL layer 340-2. For example, in some implementations, it may be advantageous in terms of decreasing the congestion of conductive pathways to/from the conductive features of the top surface of the die that was received at 202 and the active or passive circuitry (e.g., the structure 364) provided at 214, which may advantageously reduce power noise effects in the die.

Figure 18H:
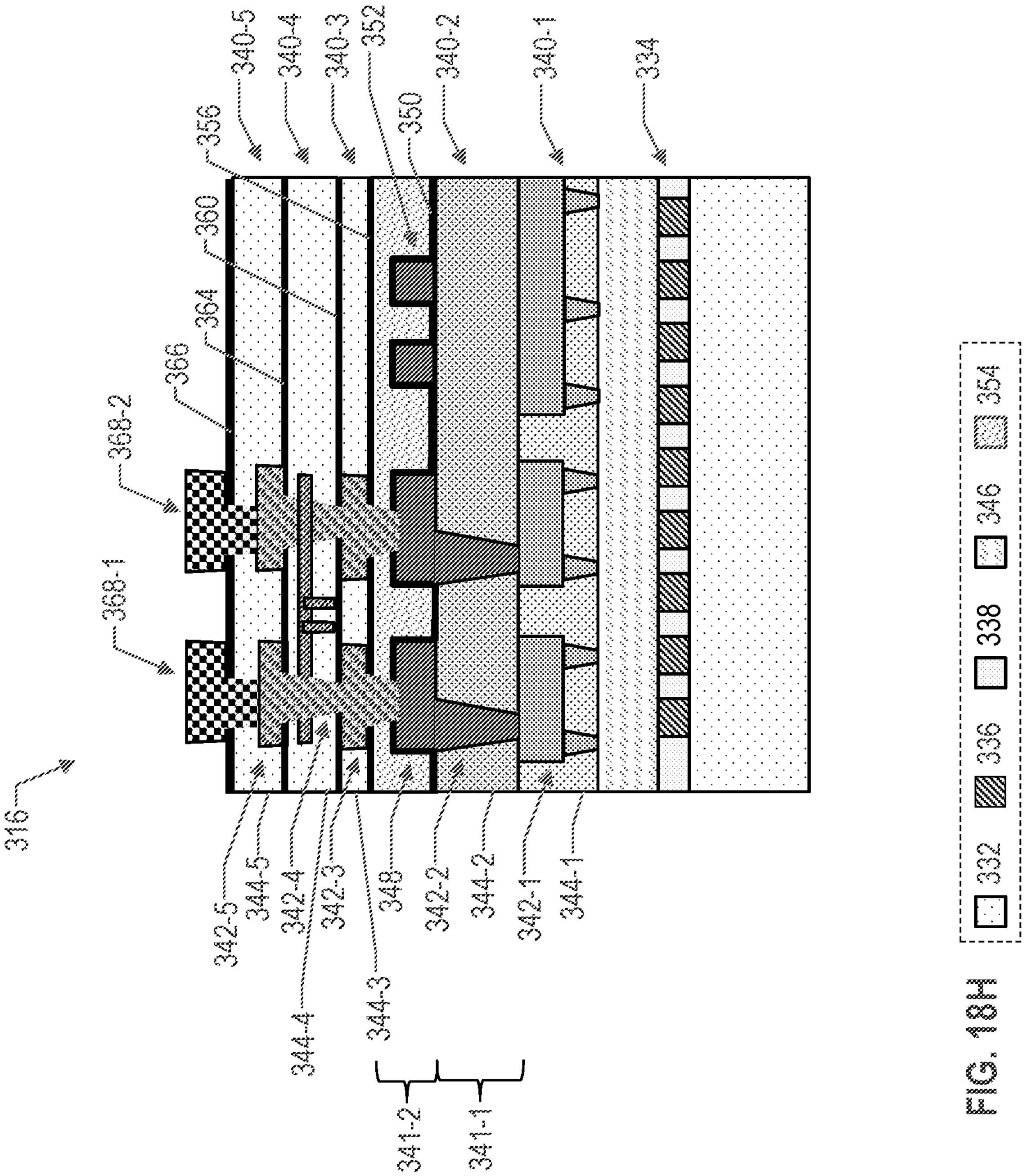

At 216, new top conductive contacts may be formed over the top surface of the die. A die 316, depicted in FIG. 18H, illustrates an example of the die 314 over which a fifth BEOL layer 342-5 is formed at 216, the fifth BEOL layer 342-5 containing a plurality of fifth conductive pathways (e.g., conductive traces and/or conductive vias) 342-5 in a fifth insulating material 344-5. A passivation layer 366 may be provided over the top of the fifth BEOL layer 342-5. As shown in FIG. 18H, the die 316 further includes new top conductive contacts 368 that may protrude from the surface of the fifth BEOL layer 342-5 and may be electrically connected, through openings in the passivation layer 366, to some of the over the fifth conductive pathways 342-5 and, therefore, to the conductive pathways 342 in lower BEOL layers 340, to route power, ground, and/or signals to components connected thereto. Any suitable deposition and patterning techniques (e.g., any of those described above) for forming new top conductive contacts may be used at 216 to integrate such conductive contacts over the top surface of the die resulting from any of the processes 210, 212, or 214. For example, the process 216 may include applying any suitable etching techniques (e.g., any of those described above) to form openings to expose underlying conductive structures to which the new top conductive contacts 368 provided in the process 216 are to be electrically connected to. For example, the process 216 may include forming openings through the passivation layer 364 and the passivation layer 366 so that the new top conductive contacts 368 may be electrically connected to conductive pathways 342 in the underlying BEOL layers 340.

Figure 18I:
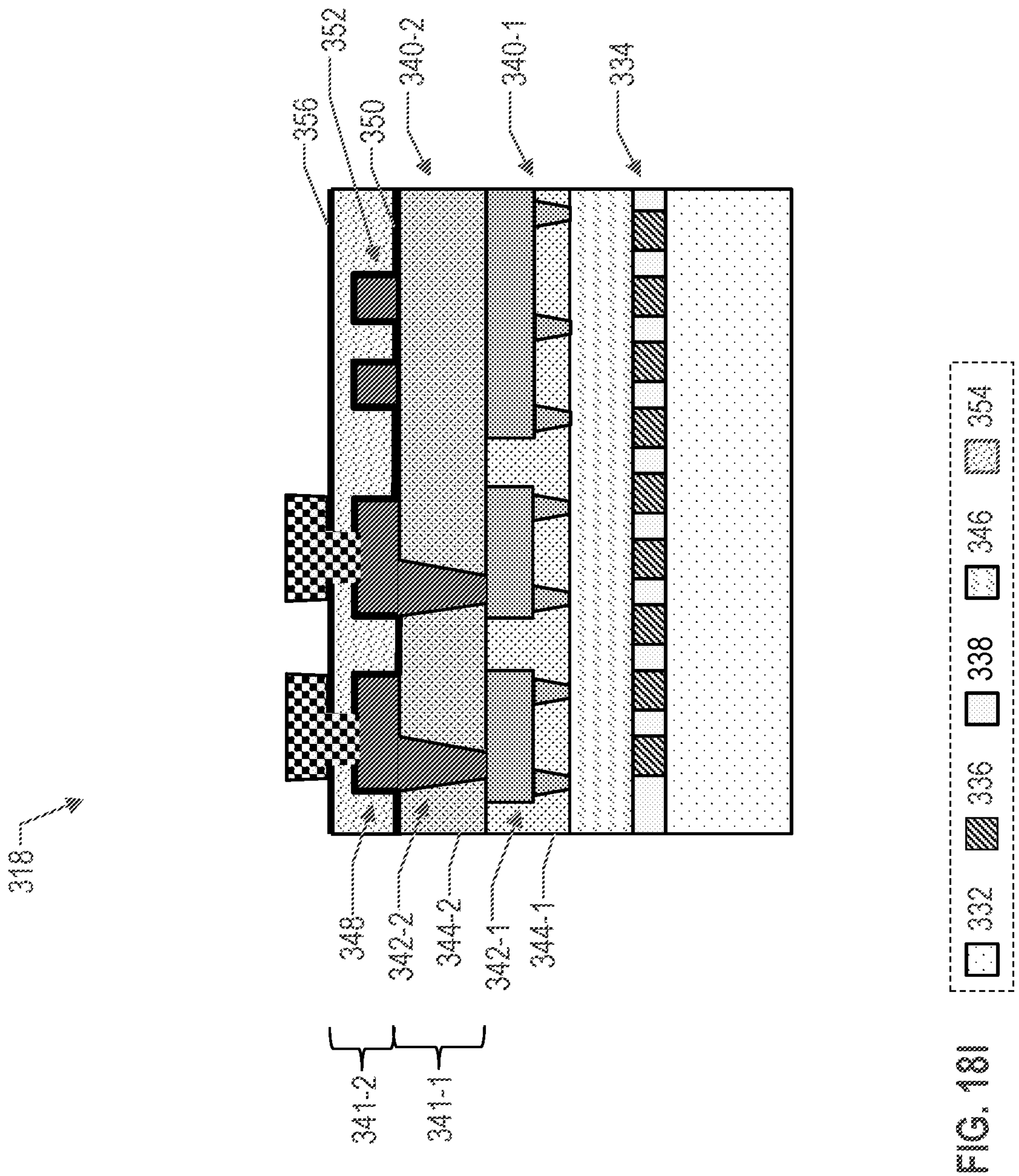
Figure 18J:
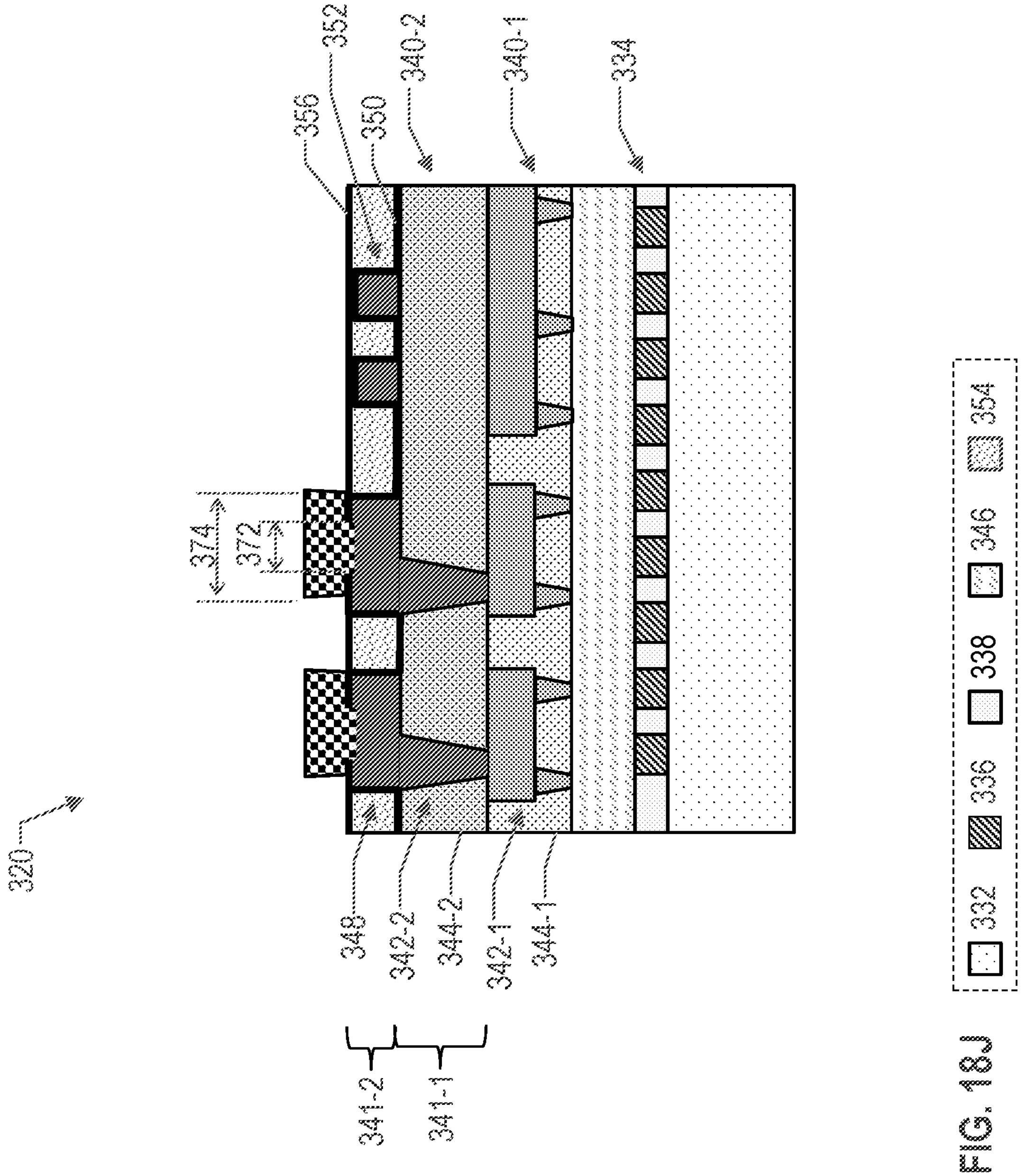

A die 318, depicted in FIG. 18I, illustrates an example of the die 310 with the new top conductive contacts 368 as described with reference to FIG. 18H formed by directly connecting to the conductive features, e.g., the conductive contacts 348, exposed by the openings 358 formed at 210. Thus, the die 318 is one example illustration of the method 200 proceeding from 210 directly to 216, without performing 212 or 214 (the possibility of which is illustrated in FIG. 2 with an arrow directly from 210 to 216). Another example of proceeding from 210 directly to 216 without performing 212 or 214 is shown with a die 320 of FIG. 18J. FIG. 18J illustrates an embodiment where the planarization performed at 206 is such that the insulating material 354 is flush with the upper surface of the conductive features, e.g., the conductive contacts 348. The passivation layer deposited at 208 has a non-zero thickness and, therefore, there will still be an opening formed through it at 210, in order to expose the conductive contacts 348 so that an electrical connection may be made between the new top conductive contacts 368 and the original conductive contacts 348. Thus, characteristic of the use of the method 200 may be that the width of the openings formed at 210 (a dimension shown in FIG. 18J as a width 372) may be smaller than the width of the new top conductive contacts 368 (a dimension shown in FIG. 18J as a width 374). Forming the new conductive contacts 368 over the top surface of the die 302 that was received from a given foundry or manufacturer may advantageously allow addressing the challenge of unifying the metal and passivation materials used by different foundries or manufacturers, so that different dies may be included within a single microelectronic assembly 100 in a manner that is less costly and complex.

In general, the insulating materials 344 of the BEOL layers 340 starting with the third BEOL layer 340-3 may include any of the insulating materials described for the BEOL layers 340-1 and 340-2; the passivation layers 360, 364, 366 may include any of the materials described for the passivation layers 350 and 354; and the conductive pathways 342 of the BEOL layers 340 starting with the third BEOL layer 340-3 may include any of the conductive materials described for the BEOL layers 340-1 and 340-2. However, the dies 312, 314, 316, 318, and 320 will also exhibit several additional features that are characteristic of the use of the method 200.

One such feature is that, similar to the insulating material 254, the insulating materials 344 of the BEOL layers 340 starting with the third BEOL layer 340-3 may have different (e.g., at least about 2% different or at least about 5% different) stochiometry, density, porosity, compressive vs. tensile stress, or other material characteristics compared to the insulating materials 344-1 and 344-2 even though the same namesake insulating materials may be used.

Another characteristic feature is that, similar to the passivation layer 356, the passivation layers 360, 364, 366 may have different (e.g., at least about 2% different or at least about 5% different) stochiometry, density, porosity, compressive vs. tensile stress, or other material characteristics compared to the passivation layer 350 even though the same namesake insulating materials may be used.

Yet another characteristic feature is that, similar to the conductive pathways 342-1, the conductive pathways 342 of the BEOL layers 340 starting with the third BEOL layer 340-3 be formed of a different metal than the conductive pathways 342-2. Thus, in some implementations of the method 200, a resulting die may include a BEOL layer 340 with conductive pathways 342 of one metal be sandwiched between BEOL layers 340 with conductive pathways 342 of another metal. For example, in some embodiments, the first conductive pathways 342-1 and the third conductive pathways 342-3 may be formed of copper, while the second conductive pathways 342-2 may be formed of aluminum. In this context, additional active or passive circuitry such as the one represented by the structure 362 would normally be implemented below (i.e., closer to the base 332 than) the layer of conductive pathways formed of aluminum, but in the die 314 or the die 316 it would be above (i.e., further away from the base 332 than) the layer of conductive pathways formed of aluminum.

Furthermore, an inset 380, shown in FIG. 18F, illustrates that a given conductive pathway, e.g., a metal trace, may include a conductive fill material 382 and a liner 384. What would be characteristic of the use of the method 200 is that, in some embodiments, a material composition of the liner 384 of either the first conductive pathways 342-1 or the second conductive pathways 342-2 is different from a material composition of the liner 384 of the third conductive pathways 342-3. For example, the liner 384 of either the first conductive pathways 342-1 or the second conductive pathways 342-2 may be a liner having one or more of tantalum, tantalum nitride, titanium nitride, and tungsten carbide, while the liner 384 of the third conductive pathways 342-3 may be a liner having one or more of tantalum, tantalum nitride, and cobalt. In any of these liners 384, any of the materials may be included in the amount of between about 5% and 50%, indicating that these materials are included by intentional alloying of materials, in contrast to potential unintentionally doping or impurities being included, which would be less than about 0.1% for any of these metals. In other embodiments, other materials and combinations of materials may be used, all being within the scope of the present disclosure. In further embodiments, thicknesses of these liners may be different. For example, in some embodiments, a thickness of the liner 384 of either the first conductive pathways 342-1 or the second conductive pathways 342-2 is different from a thickness of the liner 384 of the third conductive pathways 342-3, e.g., at least about 5% different, at least about 10% different, or at least 5-50% different. For example, in some embodiments, the liner 384 of either the first conductive pathways 342-1 or the second conductive pathways 342-2 may have a thickness between about 1 and 6 nanometers, including all values and ranges therein, while the liner 384 of the third conductive pathways 342-3 may have a thickness between about 4 and 10 nanometers, including all values and ranges therein. In other embodiments, the liner 384 of the third conductive pathways 342-3 may have a thickness between about 1 and 6 nanometers, including all values and ranges therein, while the liner 384 of either the first conductive pathways 342-1 or the second conductive pathways 342-2 may have a thickness between about 4 and 10 nanometers, including all values and ranges therein. It should be noted that, even though the inset 380 and some other cross-sectional side views of some of the conductive pathways 342 are shown as tapering down the closer they get to the base 332, which may be indicative of Damascene fabrication used to form those conductive pathways, in various embodiments, any of the conductive pathways 342 described herein may be fabricated using any suitable technique, e.g., Damascene, dual Damascene, SAP, or subtractive fabrication.

Still another characteristic feature of the use of the method 200 is that the old conductive contacts, i.e., the conductive contacts 348 that were present on the die 302 received at 202, may be buried below the surface of the dies 312, 314, 316, 318, and 320, covered by the additional materials provided at 212, 214, and 216. A related feature is that the conductive contacts 348 that were present on the die 302 received at 202 may be directly electrically connected to conductive pathways both below and above the second sub-layer 341-2 of the second BEOL layer 340-2. This is drastically different form conventional dies, where conductive contacts are electrically connected to conductive pathways on one side, but to interconnects such as DTD or DTPS interconnects on the other.

The IC dies fabricated using hybrid integration of BEOL layers for disaggregated technologies as disclosed herein, and the microelectronic assemblies 100 with such dies as disclosed herein may be included in any suitable electronic component. FIGS. 19-22 illustrate various examples of apparatuses that may include, or be included in, any of the dies fabricated using hybrid integration of BEOL layers for disaggregated technologies disclosed herein or any of the microelectronic assemblies 100 disclosed herein.

Figure 19:
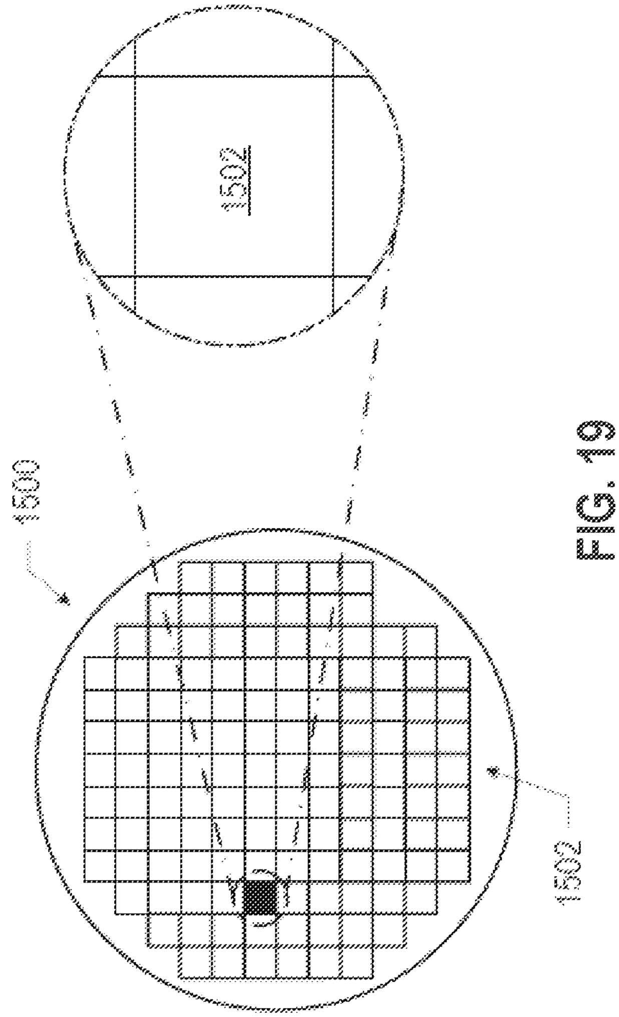
FIG. 19 is a top view of a wafer and dies that may be included in a microelectronic assembly, in accordance with any of the embodiments disclosed herein.

FIG. 19 is a top view of a wafer 1500 and dies 1502 that may include any of the dies fabricated using hybrid integration of BEOL layers for disaggregated technologies disclosed herein (e.g., any suitable ones of the dies 114) and that may be included in any of the microelectronic assemblies 100 disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 20, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 22) or other logic that is configured to store information in the memory devices or execute instructions stored in the memory array. Various ones of the dies fabricated using hybrid integration of BEOL layers for disaggregated technologies as disclosed herein may be processed as a part of the wafer 1500 that includes others of the dies 114, and the wafer 1500 is subsequently singulated.

Figure 20:
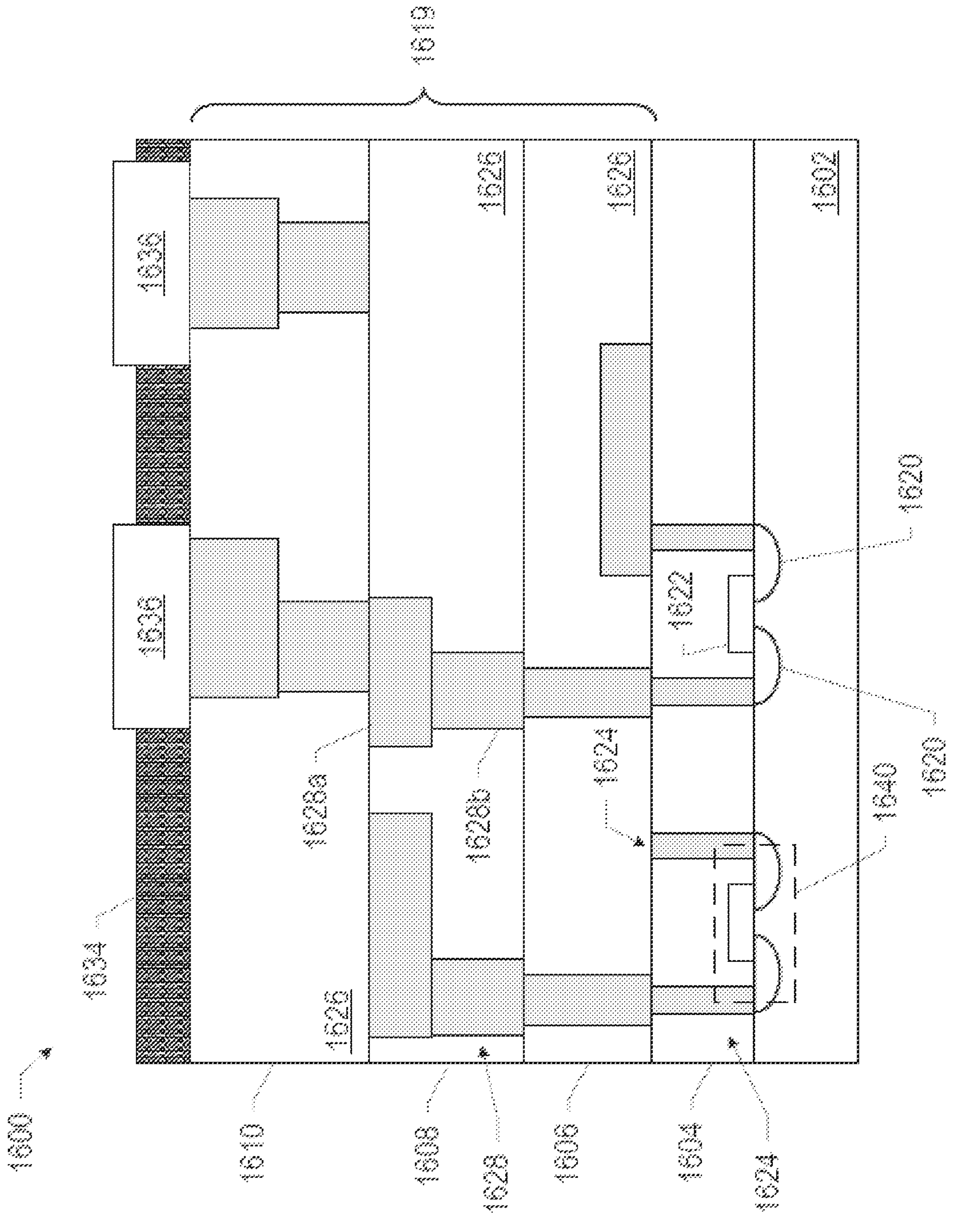
FIG. 20 is a cross-sectional side view of an IC device that may be included in a microelectronic assembly, in accordance with any of the embodiments disclosed herein.

FIG. 20 is a cross-sectional side view of an IC device 1600 that may be included in any of the dies fabricated using hybrid integration of BEOL layers for disaggregated technologies disclosed herein (e.g., any suitable ones of the dies 114) and/or in any of the microelectronic assemblies 100 with such dies. One or more of the IC devices 1600 may be included in one or more dies 1502 (FIG. 19). The IC device 1600 may be formed on a die substrate 1602 (e.g., the wafer 1500 of FIG. 19) and may be included in a die (e.g., the die 1502 of FIG. 19). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 19) or a wafer (e.g., the wafer 1500 of FIG. 19).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 20 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 20 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 20. Although a particular number of interconnect layers 1606-1610 is depicted in FIG. 20, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the die substrate 1602 upon which the device layer 1604 is formed. For example, the lines 1628*a* may route electrical signals in a direction in and out of the page from the perspective of FIG. 20. The vias 1628*b* may be arranged to route electrical signals in a direction of a plane that is substantially perpendicular to the surface of the die substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 20. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual Damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 20, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components. The conductive contacts 1636 may serve as the conductive contacts 122 or 124, as appropriate.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636. These additional conductive contacts may serve as the conductive contacts 122 or 124, as appropriate.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636. These additional conductive contacts may serve as the conductive contacts 122 or 124, as appropriate.

Figure 21:
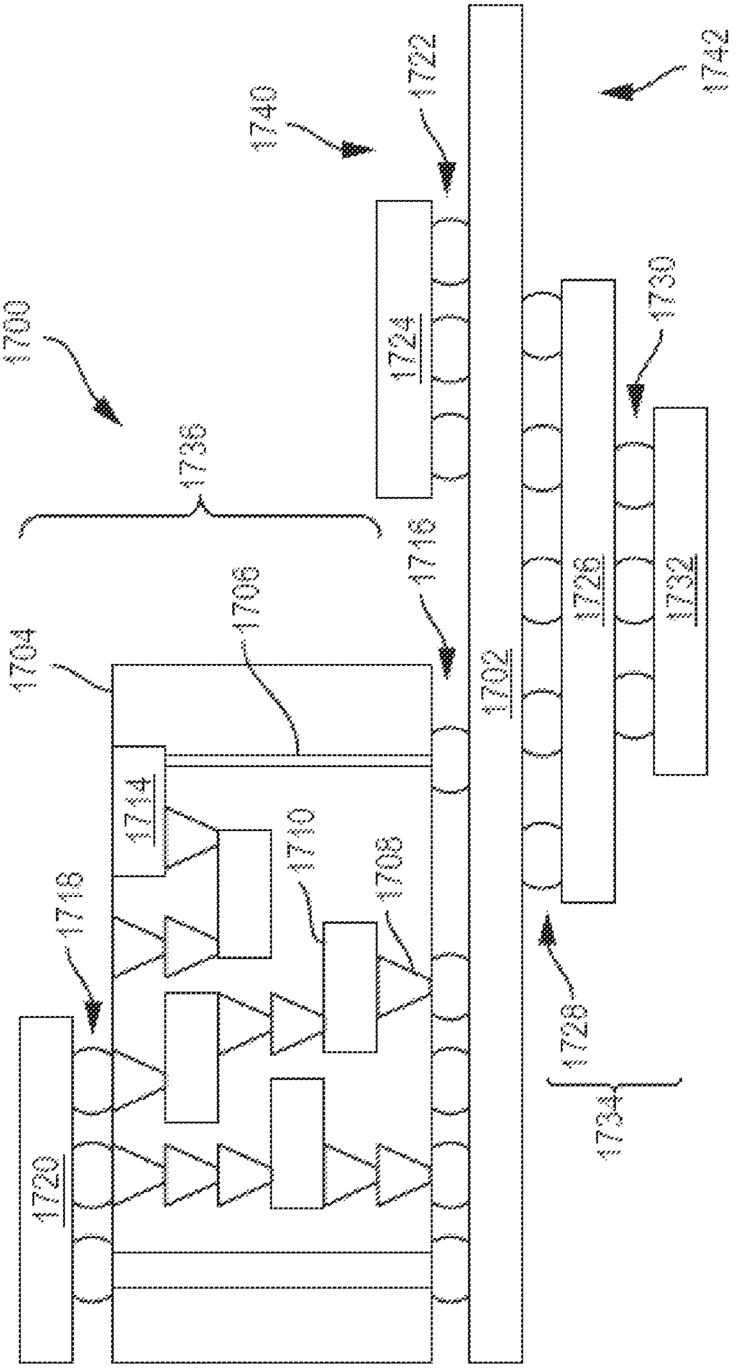
FIG. 21 is a cross-sectional side view of an IC device assembly that may include a microelectronic assembly, in accordance with any of the embodiments disclosed herein.

FIG. 21 is a cross-sectional side view of an IC device assembly 1700 that may include any of the dies fabricated using hybrid integration of BEOL layers for disaggregated technologies disclosed herein (e.g., any suitable ones of the dies 114) and/or any of the microelectronic assemblies 100 disclosed herein. In some embodiments, the IC device assembly 1700 may be a microelectronic assembly 100 where at least one of the dies 114 is a die fabricated using hybrid integration of BEOL layers for disaggregated technologies disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, the circuit board 133.

The IC device assembly 1700 illustrated in FIG. 21 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 21), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 21, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 19), an IC device (e.g., the IC device 1600 of FIG. 20), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 21, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 21 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 22:
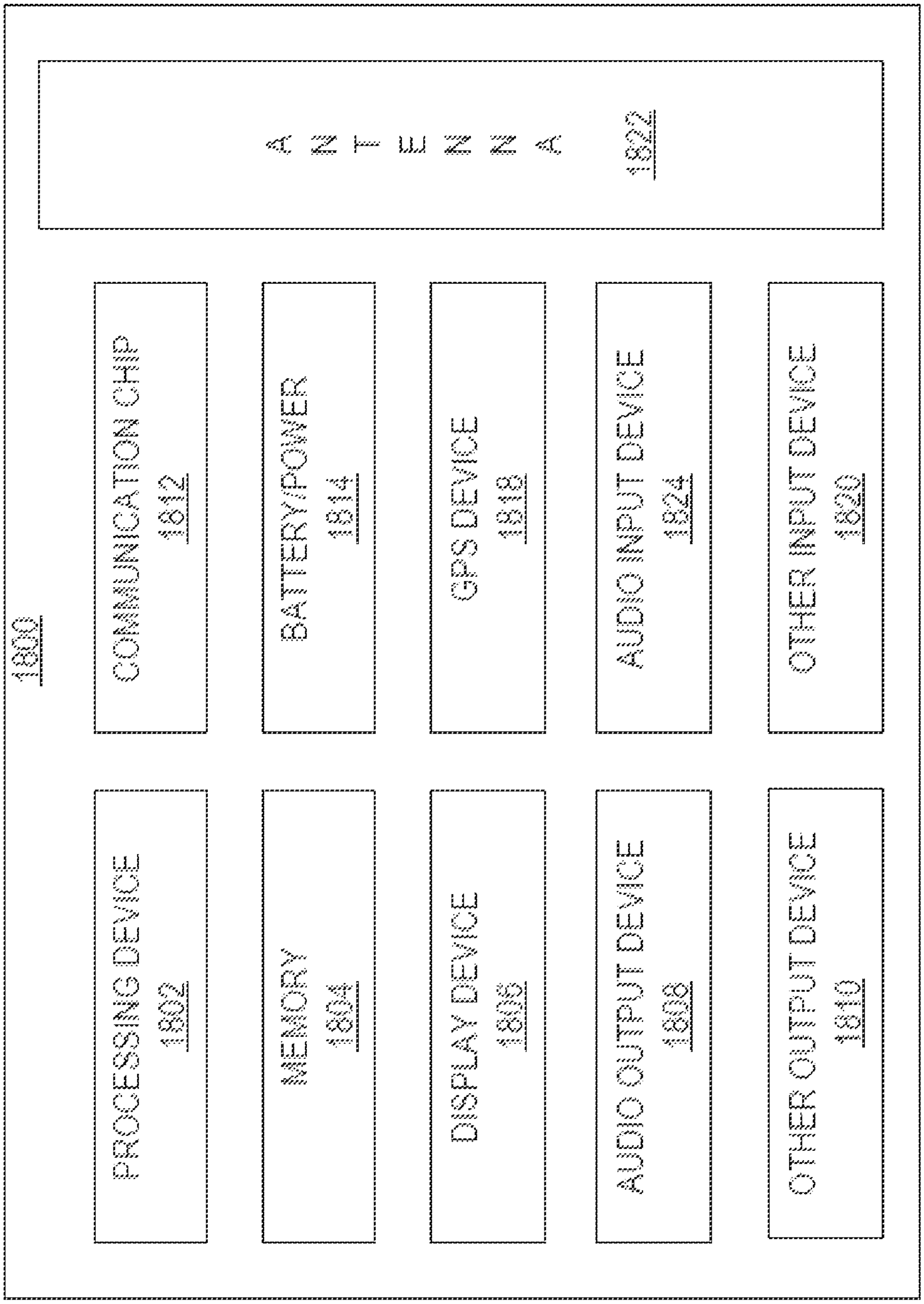
FIG. 22 is a block diagram of an example electrical device that may include a microelectronic assembly, in accordance with any of the embodiments disclosed herein.

FIG. 22 is a block diagram of an example electrical device 1800 that may include any of the dies fabricated using hybrid integration of BEOL layers for disaggregated technologies disclosed herein (e.g., any suitable ones of the dies 114) and/or one or more of the microelectronic assemblies 100 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 100 disclosed herein. A number of components are illustrated in FIG. 22 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single SoC die.

Additionally, in various embodiments, the electrical device 1800 may not include one or more of the components illustrated in FIG. 22, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic RAM (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic RAM or spin transfer torque magnetic RAM (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 provides an IC die that includes: a base; a FEOL layer over the base, the FEOL layer including active or passive circuitry (e.g., transistors, diodes, resistors, inductors, and capacitors, among others); a first BEOL layer including first conductive pathways (e.g., conductive traces and/or conductive vias); a second BEOL layer including second conductive pathways; and a third BEOL layer including third conductive pathways, where the first BEOL layer is between the FEOL layer and the second BEOL layer, the second BEOL layer is between the first BEOL layer and the third BEOL layer, and an electrically conductive fill material of the second conductive pathways is different from an electrically conductive fill material of the first conductive pathways and from an electrically conductive fill material of the third conductive pathways.

Example 2 provides the IC die according to example 1, where the electrically conductive fill material of the second conductive pathways includes aluminum, and where at least one of the electrically conductive fill material of the first conductive pathways or the electrically conductive fill material of the third conductive pathways includes copper.

Example 3 provides the IC die according to any one of examples 1-2, where the second BEOL layer includes a first sub-layer and a second sub-layer, the first sub-layer is between the FEOL layer and the second sub-layer and includes a first subset of the second conductive pathways separated from one another by a first insulator material, the second sub-layer is between the first sub-layer and the third BEOL layer and includes a second subset of the second conductive pathways separated from one another by a second insulator material, and the second insulator material and the first insulator material have different material compositions.

Example 4 provides the IC die according to example 3, where a portion of the second insulator material is above the second subset of the second conductive pathways, and at least one of the third conductive pathways extends through the portion of the second insulator material that is above the second subset of the second conductive pathways and contacts at least one of the second subset of the second conductive pathways.

Example 5 provides the IC die according to example 4, further including an intermediate layer over the second subset of second conductive pathways, where the at least one of the third conductive pathways extends through the intermediate layer.

Example 6 provides the IC die according to example 5, the intermediate layer is between the second subset of the second conductive pathways and the portion of the second insulator material that is above the second subset of the second conductive pathways.

Example 7 provides the IC die according to any one of examples 5-6, where the intermediate layer is further at an interface between the first insulator material and the second insulator material.

Example 8 provides the IC die according to any one of examples 5-7, where the third conductive pathways are separated from one another by a third insulator material, the intermediate layer is a first intermediate layer, and the IC die further includes a second intermediate layer at an interface between the second insulator material and the third insulator material.

Example 9 provides the IC die according to example 8, where the at least one of the third conductive pathways extends through the second intermediate layer.

Example 10 provides the IC die according to any one of examples 1-9, further including one or more capacitors in the third BEOL layer.

Example 11 provides the IC die according to any one of examples 1-10, where at least some of the first conductive pathways include a liner and an electrically conductive fill material, at least some of the third conductive pathways include a liner and an electrically conductive fill material, and a material composition of the liner of the first conductive pathways is different from a material composition of the liner of the third conductive pathways.

Example 12 provides the IC die according to example 11, where a thickness of the liner of the first conductive pathways is different from a thickness of the liner of the third conductive pathways, e.g., at least about 5% different, at least about 10% different, or at least 5-50% different.

Example 13 provides the IC die according to examples 11 or 12, where a material composition of the electrically conductive fill material of the first conductive pathways is different from a material composition of the electrically conductive fill material of the third conductive pathways. For example, the electrically conductive fill material of the first conductive pathways may include copper (Cu), while the electrically conductive fill material of the third conductive pathways may include tungsten (W), aluminum (Al), ruthenium (Ru), cobalt (Co), or AlCu (e.g., in proportions of between 1:1 to 1:100).

Example 14 provides the IC die according to any one of examples 1-13, where the second BEOL layer further includes a conductive pad.

Example 15 provides the IC die according to example 14, where the conductive pad has a first face and a second face, the first face is closer to the base than the second face, one of the second conductive pathways is electrically connected to the first face of the conductive pad, and one of the third conductive pathways is electrically connected to the second face of the conductive pad.

Example 16 provides an IC die that includes a device layer, including active or passive circuitry (e.g., transistors, diodes, resistors, inductors, and capacitors, among others); a first metallization layer over the device layer, the first metallization layer including a first insulator material having a first face and a second face opposite the first face, and further including first conductive pathways (e.g., conductive traces and/or conductive vias) in the first insulator material, where the first face is closer to the device layer than the second face; a layer including conductive contacts at the second face of the metallization layer; and a second metallization layer including second conductive pathways (e.g., conductive traces and/or conductive vias), where the layer is between the first metallization layer and the second metallization layer.

Example 17 provides the IC die according to example 16, where the conductive contacts include conductive pads.

Example 18 provides the IC die according to examples 16 or 17, where at least one of the conductive contacts is electrically connected to one of the first conductive pathways on one side of the at least one of the conductive contacts and is electrically connected to one of the second conductive pathways on another side of the at least one of the conductive contacts.

Example 19 provides the IC die according to any one of examples 16-18, where at least one of the conductive contacts is electrically connected to one of the first conductive pathways on one side of the at least one of the conductive contacts and is not electrically connected to any further pathways above the second face of the first metallization layer.

Example 20 provides an IC die that includes a device layer, including active or passive circuitry (e.g., transistors, diodes, resistors, inductors, and capacitors, among others); a first metallization layer over the device layer, the first metallization layer including a first insulator material and first conductive pathways (e.g., conductive traces and/or conductive vias) in the first insulator material; a second metallization layer over the device layer, the second metallization layer including a second insulator material and second conductive pathways (e.g., conductive traces and/or conductive vias) in the second insulator material; and conductive contacts buried in a layer of a third insulator material between the first metallization layer and the second metallization layer.

Example 21 provides the IC die according to example 20, where at least one of the conductive contacts is electrically connected to one of the first conductive pathways on one side of the at least one of the conductive contacts and is electrically connected to one of the second conductive pathways on another side of the at least one of the conductive contacts.

Example 22 provides an IC package that includes an IC die including an IC die according to any one of examples 1-21; and a further IC component, coupled to the IC die.

Example 23 provides the IC package according to example 22, where the further IC component includes a package substrate.

Example 24 provides the IC package according to example 22, where the further IC component includes an interposer.

Example 25 provides the IC package according to example 22, where the further IC component includes a further IC die.

Example 26 provides a computing device that includes a carrier substrate and an IC die coupled to the carrier substrate, where the IC die is an IC die according to any one of examples 1-21, or the IC die is included in the IC package according to any one of examples 22-25.

Example 27 provides the computing device according to example 26, where the computing device is a wearable or handheld computing device.

Example 28 provides the computing device according to examples 26 or 27, where the computing device further includes one or more communication chips.

Example 29 provides the computing device according to any one of examples 26-28, where the computing device further includes an antenna.

Example 30 provides the computing device according to any one of examples 26-29, where the carrier substrate is a motherboard.

Example 31 provides the IC die according to any one of examples 1-21, where the IC die includes or is a part of a central processing unit.

Example 32 provides the IC die according to any one of examples 1-31, where the IC die includes or is a part of a memory device.

Example 33 provides the IC die according to any one of examples 1-32, where the IC die includes or is a part of a logic circuit.

Example 34 provides the IC die according to any one of examples 1-33, where the IC die includes or is a part of input/output circuitry.

Example 35 provides the IC die according to any one of examples 1-34, where the IC die includes or is a part of a field programmable gate array transceiver.

Example 36 provides the IC die according to any one of examples 1-35, where the IC die includes or is a part of a field programmable gate array logic.

Example 37 provides the IC die according to any one of examples 1-36, where the IC die includes or is a part of a power delivery circuitry.

Example 38 provides the IC die according to any one of examples 1-37, where the IC die includes or is a part of a III-V amplifier.

Example 39 provides the IC die according to any one of examples 1-38, where the IC die includes or is a part of Peripheral Component Interconnect Express circuitry or Double Data Rate transfer circuitry.

The invention claimed is:

1. An integrated circuit (IC) die, comprising:

a base;

a front-end-of-line (FEOL) layer over the base, the FEOL layer comprising active or passive circuitry;

a first back-end-of-line (BEOL) layer comprising first conductive pathways;

a second BEOL layer comprising second conductive pathways; and a third BEOL layer comprising third conductive pathways, wherein the first BEOL layer is between the FEOL layer and the second BEOL layer, the second BEOL layer is between the first BEOL layer and the third BEOL layer, an electrically conductive fill material of the second conductive pathways is different from an electrically conductive fill material of the first conductive pathways and from an electrically conductive fill material of the third conductive pathways, the first conductive pathways include a first conductive trace, the second conductive pathways include a second conductive trace, and the third conductive pathways include a third conductive trace.

2. The IC die according to claim 1, wherein the electrically conductive fill material of the second conductive pathways includes aluminum, and wherein at least one of the electrically conductive fill material of the first conductive pathways or the electrically conductive fill material of the third conductive pathways includes copper.

3. The IC die according to claim 1, wherein:

the second BEOL layer includes a first sub-layer and a second sub-layer, the first sub-layer is between the FEOL layer and the second sub-layer and includes a first subset of the second conductive pathways separated from one another by a first insulator material, the second sub-layer is between the first sub-layer and the third BEOL layer and includes a second subset of the second conductive pathways separated from one another by a second insulator material, and the second insulator material and the first insulator material have different material compositions.

4. The IC die according to claim 3, wherein:

a portion of the second insulator material is above the second subset of the second conductive pathways, and at least one of the third conductive pathways extends through the portion of the second insulator material that is above the second subset of the second conductive pathways and contacts at least one of the second subset of the second conductive pathways.

5. The IC die according to claim 4, further comprising an intermediate layer over the second subset of second conductive pathways, wherein the at least one of the third conductive pathways extends through the intermediate layer.

6. The IC die according to claim 5, the intermediate layer is between the second subset of the second conductive pathways and the portion of the second insulator material that is above the second subset of the second conductive pathways.

7. The IC die according to claim 5, wherein the intermediate layer is further at an interface between the first insulator material and the second insulator material.

8. The IC die according to claim 5, wherein:

the third conductive pathways are separated from one another by a third insulator material, the intermediate layer is a first intermediate layer, and the IC die further includes a second intermediate layer at an interface between the second insulator material and the third insulator material.

9. The IC die according to claim 8, wherein the at least one of the third conductive pathways extends through the second intermediate layer.

10. The IC die according to claim 1, further comprising one or more capacitors in the third BEOL layer.

11. The IC die according to claim 1, wherein:

at least some of the first conductive pathways include a liner and an electrically conductive fill material, at least some of the third conductive pathways include a liner and an electrically conductive fill material, and a material composition of the liner of the first conductive pathways is different from a material composition of the liner of the third conductive pathways.

12. The IC die according to claim 11, wherein a material composition of the electrically conductive fill material of the first conductive pathways is different from a material composition of the electrically conductive fill material of the third conductive pathways.

13. The IC die according to claim 1, wherein the second BEOL layer further includes a conductive pad.

14. The IC die according to claim 13, wherein the conductive pad has a first face and a second face, the first face is closer to the base than the second face, one of the second conductive pathways is connected to the first face of the conductive pad, and one of the third conductive pathways is connected to the second face of the conductive pad.

15. An integrated circuit (IC) die, comprising:

a device layer, comprising active or passive circuitry;

a first interconnect layer over the device layer, the first interconnect layer comprising a first insulator material having a first face and a second face opposite the first face, and further comprising first conductive pathways in the first insulator material, wherein the first face is closer to the device layer than the second face;

a second interconnect layer comprising second conductive pathways; and a layer comprising conductive contacts at the second face of the first interconnect layer, wherein:

the layer is between the first interconnect layer and the second interconnect layer, the layer includes a liner on sidewalls and at least portions of top surfaces of the conductive contacts, the liner includes silicon and one or more of oxygen and nitrogen, and at least one of the conductive contacts is connected to one of the first conductive pathways on one side of the at least one of the conductive contacts and is connected to one of the second conductive pathways on another side of the at least one of the conductive contacts.

16. The IC die according to claim 15, wherein the conductive contacts include conductive pads.

17. The IC die according to claim 15, wherein at least one additional conductive contact of the conductive contacts is connected to one additional first conductive pathway of the first conductive pathways on one side of the at least one additional conductive contact of the conductive contacts and is not connected to any further pathways above the second face.

18. The IC die according to claim 15, wherein:

the layer includes third conductive pathways, the first conductive pathways include a first conductive trace or a first conductive via, the second conductive pathways include a second conductive trace or a second conductive via, the third conductive pathways include a third conductive trace or a third conductive via, and an electrically conductive fill material of the third conductive pathways is different from an electrically conductive fill material of the first conductive pathways and from an electrically conductive fill material of the second conductive pathways.

19. An integrated circuit (IC) die, comprising:

a device layer, comprising active or passive circuitry;

a first interconnect layer over the device layer, the first interconnect layer comprising a first insulator material and first conductive pathways in the first insulator material;

a second interconnect layer over the device layer, the second interconnect layer comprising a second insulator material and second conductive pathways in the second insulator material;

conductive contacts buried in a layer of a third insulator material between the first interconnect layer and the second interconnect layer; and a liner on sidewalls and at least portions of top surfaces of the conductive contacts, the liner comprising silicon and one or more of oxygen and nitrogen, wherein:

the layer of the third insulator material includes third conductive pathways, the first conductive pathways include a first conductive via, the second conductive pathways include a second conductive via, the third conductive pathways include a third conductive via, and an electrically conductive fill material of the third conductive pathways is different from an electrically conductive fill material of the first conductive pathways and from an electrically conductive fill material of the second conductive pathways.

20. The IC die according to claim 19, wherein at least one of the conductive contacts is connected to one of the first conductive pathways on one side of the at least one of the conductive contacts and is connected to one of the second conductive pathways on another side of the at least one of the conductive contacts.

21. The IC die according to claim 19, wherein the conductive contacts include conductive pads.

22. The IC die according to claim 19, wherein:

the first insulator material has a first face and a second face opposite the first face, and at least one of the conductive contacts is connected to one of the first conductive pathways on one side of the at least one of the conductive contacts and is not connected to any further pathways above the second face.

* * * * *